US009608570B1

(12) United States Patent
Jenkins et al.

(10) Patent No.: US 9,608,570 B1
(45) Date of Patent: Mar. 28, 2017

(54) AMPLIFIER CALIBRATION METHODS AND CIRCUITS

(71) Applicant: UNSW Innovations Pty. Ltd., Sydney (AU)

(72) Inventors: Julian Jenkins, Kurraba Point (AU); Torsten Lehmann, Earlwood (AU); Tara Hamilton, Revesby (AU); Andrew Nicholson, Fairfield (AU); Artemij Iberzanov, Ryde (AU)

(73) Assignee: UNSW Innovations, UNSW Sydney (AU)

( * ) Notice: Subject to any disclaimer, the term of this patent is extended or adjusted under 35 U.S.C. 154(b) by 0 days.

(21) Appl. No.: 14/940,056

(22) Filed: Nov. 12, 2015

(51) Int. Cl.
*G01R 19/00* (2006.01)
*H03F 1/02* (2006.01)
*H03F 3/45* (2006.01)

(52) U.S. Cl.
CPC ....... *H03F 1/0205* (2013.01); *H03F 3/45179* (2013.01); *H03F 2200/228* (2013.01); *H03F 2200/375* (2013.01); *H03F 2203/45048* (2013.01)

(58) Field of Classification Search
CPC ............ H03F 1/02; H04B 17/11; H04B 17/13
USPC ........................................ 330/2, 9; 327/307
See application file for complete search history.

(56) References Cited

U.S. PATENT DOCUMENTS

2006/0176975 A1* 8/2006 Hsieh ........................ H04B 1/30 375/285
2013/0038373 A1* 2/2013 Sofer .................. H04L 25/0278 327/306

* cited by examiner

*Primary Examiner* — Steven J Mottola
(74) *Attorney, Agent, or Firm* — André Grouwstra

(57) ABSTRACT

An amplifier calibration system has a calibration controller, a comparator coupled between an amplifier to be tested and the calibration controller, and an analog test signal generator driven by the calibration controller and coupled to the amplifier input. The system applies a cycle of analog tests to the amplifier input. The cycle has an upward path and a downward path. The upward path includes three signal levels: lowest, medium low, and medium high. The downward path includes: highest, medium high, and medium low. The comparator determines successive polarities of the amplifier's responses to the cycle of analog tests. Based on the polarities, the system determines amplifier characteristics, and calibrates amplifier parameters to change the amplifier characteristics to desired values. Characteristics may include hysteresis, offset, input range values, and other amplifier specifications.

28 Claims, 14 Drawing Sheets

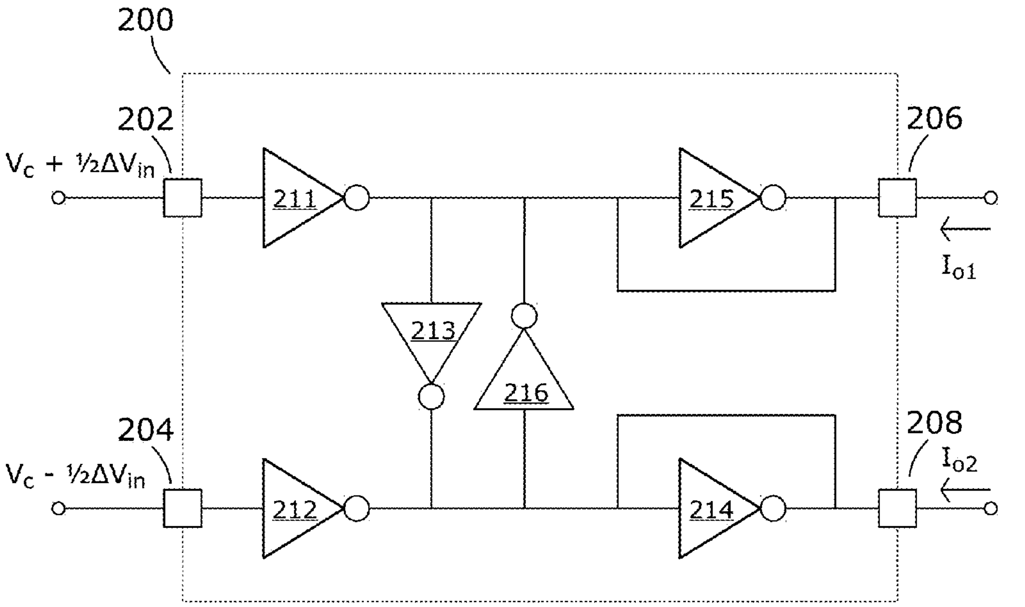
Fig. 2 - PRIOR ART
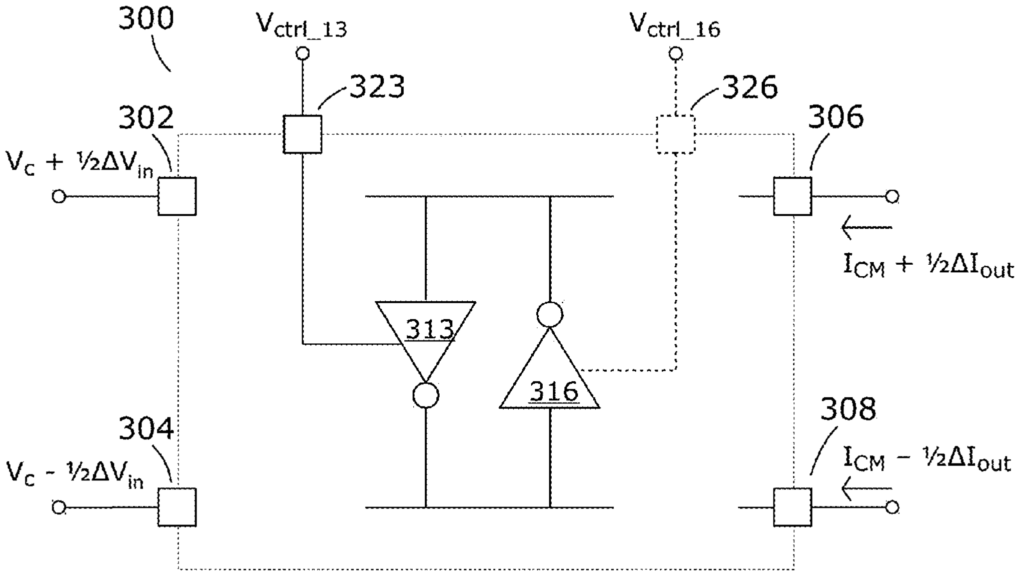
Fig. 3

(continue on next page)

AMPLIFIER CALIBRATION METHODS AND CIRCUITS

BACKGROUND

The present invention relates to calibration of analog and mixed-signal integrated circuits (ICs) and particularly to that of various classes of amplifiers.

Amplifiers have formed an important class of analog electronics circuits since the technology was first practiced. They continue to be so today, even in highly integrated circuits. A signal to be amplified is presented at an amplifier's input terminal(s), and an amplified version of that signal is available from the amplifier's output terminal(s). "Amplified" in this context means "with higher power", where the input and output signals do not necessarily need to be carried by the same physical quantity, such as voltage or current. Therefore, an amplifier may make a conversion from one physical quantity to another. On the other hand, a passive device that merely scales an input signal without amplifying its power, such as a transformer, is not considered an amplifier. Amplifiers often employ a form of feedback of the amplified signal at or near the output terminals to the input terminals. This feedback can have a negative or positive polarity, and is therefore referred to as negative or positive feedback. Negative feedback is often used when an amplifier needs to have a high precision, as negative feedback reduces errors. Positive feedback may be used when an amplifier needs to have a high gain, as positive feedback reinforces the input signal. Occasionally, amplifiers employ feed-forward instead of feedback. This technique is used as an alternative to negative feedback for improving linearity. It provides for unconditional stability. However, whichever technique is used, amplifiers can suffer degradations when implemented in the smaller modern IC fabrication technologies.

FIGS. 1A-C illustrate problems that may cause performance loss in amplifiers of all types. FIG. 1A shows case 100A, where an increase of a differential input voltage $\Delta V_{in}$ results in an increase of output signal (in this case a current) $I_{o2}$ with a concurrent decrease of output signal $I_{o1}$. At zero differential input voltage $\Delta V_{in}$, the output signals $I_{o1}$ and $I_{o2}$ are equal. The level $I_{CM}$ at which $I_{o1}$ and $I_{o2}$ are equal is usually called the common-mode current. Although the curve of $I_{o2}$ as a function of $\Delta V_{in}$ is approximately straight near $I_{CM}$, it shows non-linearity for larger values of $\Delta V_{in}$. To prevent distortion, signals need to be kept small. This may be a problem when high efficiency is needed.

FIG. 1B shows a case 100B in which $I_{o1}$ and $I_{o2}$ equal $I_{CM}$ at a non-zero differential input voltage $\Delta V_{in}=V_{offset}$. This can for instance be the case when transistors in input circuits are of unequal size or drive strength. A lower offset voltage $V_{offset}$ is generally a measure for a better balanced amplifier. It generally also results in better accuracy.

FIG. 1C illustrates a case 100C in which hysteresis occurs. Output signals Io1 and Io2 follow a different curve for a decreasing differential input voltage $\Delta V_{in}$ than they follow for an increasing differential input voltage $\Delta V_{in}$. As a result, the common mode current $I_{CM}$ is achieved at differential input voltages $\Delta V_{in}$ that depend on the signal history. The widest difference is called the hysteresis width. Hysteresis is caused by memory effects, such as may occur in a poorly parameterized amplifier with positive feedback, and it may result in inaccuracy as well as loss of speed.

The above problems were illustrated based on the example of a transconductance amplifier, which has an input voltage signal and an output current signal. However, they are equally valid for other types of amplifiers, including but not limited to voltage amplifiers, current amplifiers, and transimpedance amplifiers.

FIG. 2 illustrates an example of an amplifier 200 with positive feedback. It is commonly nicknamed the Nauta amplifier after inventor Bram Nauta, who first published about It in 1989 (Bram Nauta, Evert Seevinck, "Linear CMOS Transconductance Element for VHF Filters", Electronics Letters vol. 25 no. 7, March 1989). Nauta and Seevinck, incidentally, referred to an independent earlier publication of the circuit in U.S. Pat. No. 3,991,380 by Richard Lee Pryor, in 1976. Amplifier 200 is a transconductance amplifier, converting a differential input voltage between its input terminals 202 and 204 to a differential output current between its output terminals 206 and 208. Its gain, or rather transconductance, is defined as the differential output current divided by the differential input voltage. Ideally, it cancels any effects of a common mode voltage at the input.

This amplifier is useful in, for instance, complementary metal oxide semiconductor (CMOS) IC designs because it can combine a high gain with a broad bandwidth and large relative input and output signal ranges.

Amplifier 200 includes input buffer inverters 211 and 212, cross-coupled inverters 213 and 216, and self-coupled inverters 215 and 214. Cross-coupled inverters 213 and 216 provide amplification and positive feedback. Dependent on the balance of relative drive strengths of input buffer inverters 211 and 212 with cross-coupled inverters 213 and 216 and self-coupled inverters 215 and 214, the circuit may show a fixed relationship between input and output signals, or it may show a hysteresis. The maximum gain is also strongly dependent on the relative strengths of these buffers. To achieve optimum performance, the amplifier is designed and operated at a point close to where hysteresis would start occurring.

The relative drive strengths of the inverters 211-213 and 216 in CMOS technology is, among other factors, determined by the relative sizes of transistors in those inverters. If the relative drive strengths deviate from the ideal case, an amplifier may show inferior performance or undesired non-linearity due to the hysteresis. Mismatch of the inverters will reduce the maximum achievable gain as well as the rejection of common mode signal components. In older IC technologies it was relatively easy to obtain accurately matching transistors. In today's circuits where transistors with features much smaller than the wavelength of visible light are etched based on exposure with near-visible light, accurate size and matching are exceedingly difficult to achieve. Therefore, calibration is required to operate an amplifier in or near its optimum point.

Prior calibration circuits, such as proposed by Nauta himself, relied on matching to a replica, using duplicate structures. This type of calibration or tuning cannot operate in today's advanced technologies, because matching is no longer accurate.

A transconductance amplifier that can be calibrated has been proposed in U.S. Pat. No. 8,988,148 by Julian Jenkins, Torsten Lehmann, and James Koeppe. Among other innovations, their invention taught adding a control port to at least one of the inverters commonly seen in integrated amplifiers. However, the document did not specify a calibration method.

The present invention fills this void and teaches new calibration methods and circuits that will enable optimization of all types of amplifiers, including those exhibiting hysteresis, even in advanced IC production technologies.

SUMMARY

Amplifiers employ various feedback and feed-forward techniques to achieve high transfer accuracy, high speed, high gain, and/or high efficiency. These techniques rely on accurate parameters of at least some of the devices used, and in many cases on accurate matching of devices. If devices have inaccurate parameters and/or are inaccurately matched, performance may be compromised, for instance in the form of the occurrence of inaccuracies, loss of speed and/or gain, hysteresis, distortion, common mode effects, instability, or even bi-stability. The present invention proposes a system, circuits, and methods for calibrating amplifiers, including those with negative and positive feedback, and with feed-forward, so that they can operate optimally even in the presence of inaccurate parameters and/or mismatching devices.

In a first aspect, embodiments of the invention include a system for calibrating an amplifier comprising a comparator, a calibration controller, and an analog test signal generator configured to generate analog test signals based on test vectors received from the calibration controller. The analog test generator may comprise a digital-to-analog-converter (DAC) and one or more amplifier selection switches. The DAC may be off-the-shelf, or designed specially for a calibration procedure. In embodiments, the test controller may be configured to at least one of generate and retrieve a series of test vectors to generate a cycle of analog test signals, wherein the cycle comprises an upward path and a downward path, with a lowest level analog test signal included in the upward path, a highest level analog test signal included in the downward path, and a lower medium level and a higher medium level analog test signal each included in both the upward and downward paths.

In a second aspect, embodiments of the invention include a method for characterizing an electronic circuit such as an amplifier, comprising generating or retrieving first and second test vectors, based on the test vectors, generating first and second analog test signals, applying these to an amplifier input, determining first and second polarities of amplifier output responses, and based on these polarities determining at least one amplifier characteristic, for instance offset.

Embodiments may generate further test signals and apply these to the amplifier in a cyclic order with an upward part of the cyclic order and a downward part of the cyclic order. Based on resulting output polarities, these embodiments may determine a hysteresis characteristic.

In a third aspect, embodiments of the invention include a method for calibrating an electronic circuit such as an amplifier. The method forwards a series of analog test signals to the amplifier, wherein the series includes an upward cycle and a downward cycle. It determines polarities of a series of amplifier responses to the series of analog test signals. Based on the polarities, the embodiments determine one or more characteristics, and they determine if one of the one or more characteristics is acceptable. If not, embodiments change an amplifier calibration parameter.

Further embodiments may change at least one of the analog test signals to obtain an adjusted series of analog test signals to provide a narrower test window. They repeat the test to determine adjusted amplifier characteristics. Then they determine if an adjusted amplifier characteristic is acceptable.

As used herein, except where the context requires otherwise, the term "comprise" and variations of the term, such as "comprising", "comprises" and "comprised", are not intended to exclude further additives, components, integers or steps.

Further aspects of the present invention and further embodiments of the aspects described in the preceding paragraphs will become apparent from the following description, given by way of example and with reference to the accompanying drawings.

BRIEF DESCRIPTION OF THE DRAWINGS

The invention will be described with reference to the drawings, in which:

FIG. 2 illustrates an example of an amplifier with positive feedback;

FIG. 3 illustrates an example class of amplifiers that can be calibrated according to embodiments of the invention;

DETAILED DESCRIPTION

Figure 1A:
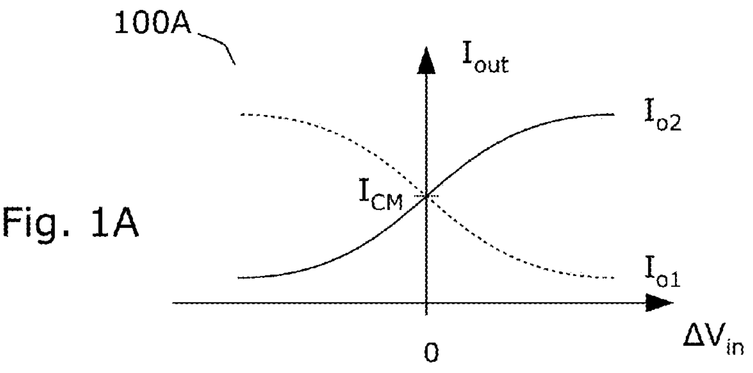
FIGS. 1A-C illustrate problems that may cause performance loss in amplifiers of all types.
Figure 1B:
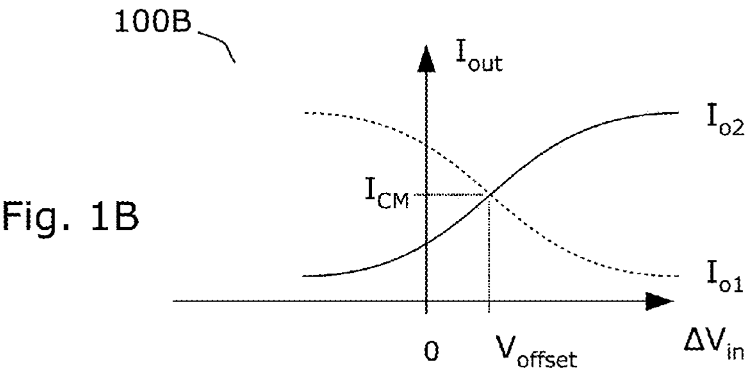
Figure 1C:
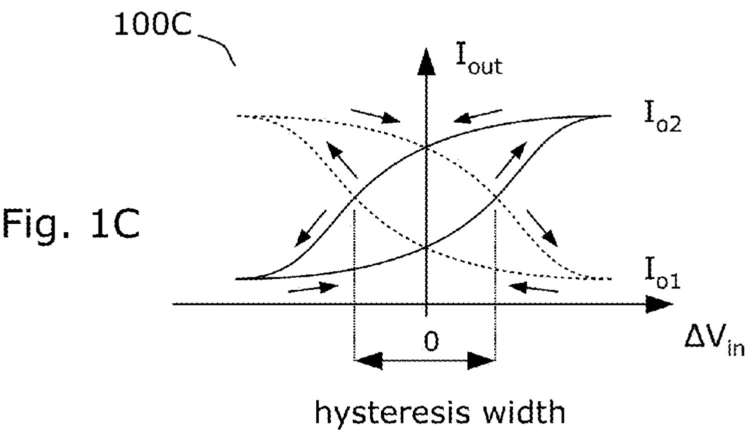

Amplifiers employ various feedback and feed-forward techniques to achieve high transfer accuracy, high speed, high gain, and/or high efficiency. These techniques rely on accurate parameters of at least some of the devices used, and in many cases on accurate matching of devices. If devices have inaccurate parameters and/or are inaccurately matched, performance may be compromised, for instance in the form of the occurrence of inaccuracies, loss of speed and/or gain, hysteresis, distortion, common mode effects, instability, or even bi-stability. The present invention proposes a system, circuits, and methods for calibrating amplifiers, including those with negative and positive feedback, and with feed-forward, so that they can operate optimally even in the presence of inaccurate parameters and/or mismatching devices.

FIG. 3 illustrates an example class of amplifiers 300 that can be calibrated according to embodiments of the invention. Amplifier 300 includes at least one signal input terminal. For instance, input terminal 302 could receive a single-ended input signal, or input terminals 302 and 304 could receive a differential input signal, such as a differential input voltage $\Delta V_{in}$ superimposed on a common mode voltage $V_c$. In general, the input signal could be represented by a voltage, current, power (as is the case when the amplifier's input impedance is required to match a precise resistance), by light, or by any other physical quantity that can carry information. Amplifier 300 further includes at least one signal output terminal. For instance, output terminal 306 could deliver a single-ended output signal, or output terminals 306 and 308 could deliver a differential output signal, such as a differential output current $\Delta I_{out}$ superimposed on a common mode current $I_{CM}$. In general, the output signal could be represented by voltage, current, power, light, or any other physical quantity that can carry information.

Example amplifier 300 may include an amplifier element with positive amplification whose output is coupled with its input providing a path for positive feedback. Or it may include two amplifier elements with negative amplification coupled in a circular fashion to provide a path for positive feedback. For instance, an output of inverter 313 is coupled with an input of inverter 316, whose output is coupled with the input of inverter 313. Or it may include any other amplifying device in a negative or positive feedback or a feed-forward configuration.

Amplifier 300 includes at least one calibration terminal to calibrate a parameter of an included amplifier element. For instance, an embodiment may include calibration terminal 323 to calibrate a parameter of inverter 313. Further embodiments may include calibration terminal 326 to calibrate a parameter of inverter 316, etc. Some amplifier elements may not be configured for calibration, whereas other elements may have one or multiple parameters that must be calibrated.

Figure 4A:
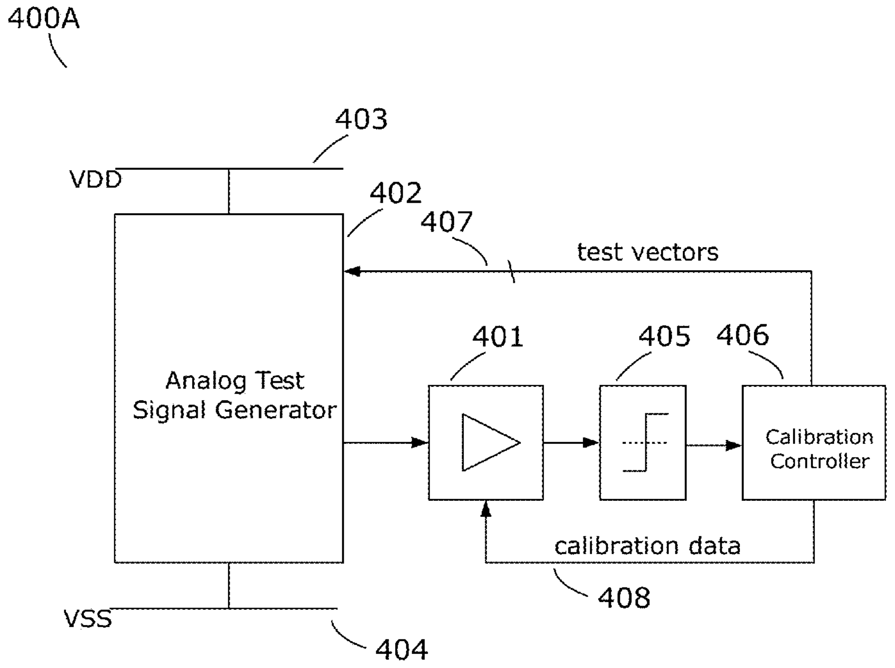
FIGS. 4A-B illustrate calibration systems according to embodiments of the invention.
Figure 4B:
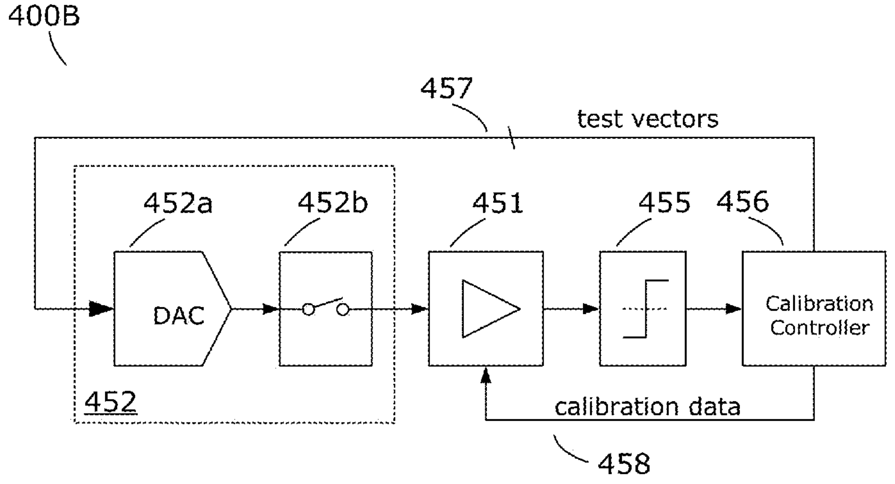

FIG. 4A-B illustrate calibration systems according to embodiments of the invention. FIG. 4A illustrates an example embodiment 400A that is very suitable for integration in a single IC with one or more amplifiers to be calibrated. This embodiment includes amplifier 401, whose output is coupled with a comparator 405 input. Comparator 405 has an output coupled with an input of calibration controller 406. Calibration controller 406 provides test vector 407 (drawn as a single arrow, but including multiple control signals, typically in the digital domain) to control analog test signal generator 402, and calibration data 408 for amplifier 401. Although calibration system 400 is drawn with single-ended signals for amplifier 401, analog test signal generator 402, and comparator 405, embodiments may use differential signals for any of these blocks.

Analog test signal generator 402 may include a network of switches, each one of which is controlled by a test vector 407 control signal, and resistors, to provide various analog test signals to the input(s) of amplifier 401. Embodiments may derive analog test signals from (and include) supply voltage VDD 403 and ground reference VSS 404. For amplifiers 401 whose input signals are represented by voltages, embodiments generate test voltages. For amplifiers 401 whose input signals are represented by currents, embodiments generate test currents. For amplifiers 401 whose input signals are represented by another physical quantity, embodiments generate test signals in that particular physical quantity. While embodiments of analog test signal generator 402 are configured for and capable of applying analog test signals to amplifier 401, they are also configured for and capable of isolating amplifier 401 from any of their internal signals.

Comparator 405 acts as a 1-bit analog-to-digital converter on amplifier 401's output signal. If amplifier 401's output signal is positive, comparator 405 will produce a digital output signal of at least 1 bit to indicate this positive state. If amplifier 401's output signal is negative, comparator 405's output result will reflect this negative state.

Calibration controller 406 performs amplifier characterization and calibration according to embodiments of the invention. Calibration controller 406 may include combinatorial logic, clocked logic, and memory elements, and/or embodiments of calibration controller 406 may include a programmable processor that runs software or firmware implementations of characterization and calibration methods according to embodiments of the invention.

Although FIG. 4 shows a calibration system 400 supporting a single amplifier 401, the system may be extended to support multiple amplifiers. Signal multiplexers may successively couple each of the multiple amplifiers with both the analog test signal generator 402 and comparator 405, where the signal multiplexers are controlled by calibration controller 406. In an alternative configuration, multiple comparators 405 may be used, each coupled with one of the multiple amplifiers, and a digital multiplexer controlled by calibration controller 406 may select the correct comparator 405 output as the input signal for calibration controller 406.

FIG. 4B illustrates an example embodiment calibration system 400B that is very suitable for one-time calibration, such as in an IC engineering or production testing environment. Amplifier 451 to be calibrated may be situated in a die on a semiconductor wafer during a production test stage known as wafer probing. Or it may be situated in a packaged IC undergoing its final test. In both cases, automated test equipment (ATE) has electrical access to amplifier 451 to provide test stimuli to one or more amplifier 451 inputs and to measure its resulting output responses. Analog test signal generator 452 is equivalent to analog test signal generator 402 of FIG. 4A. Calibration controller 456 and digital-to-analog-converter (DAC) 452*a* may be standard parts built into the ATE, or they may be part of a custom-built test load board interfacing between the ATE and ICs to be tested.

Calibration controller 456 may include combinatorial logic, clocked logic, and memory elements, and/or embodiments of calibration controller 456 may include a programmable processor that runs software or firmware implementations of characterization and calibration methods according to embodiments of the invention. DAC 452*a* may be a general purpose DAC as available in off-the-shelf ICs, or it may be a custom-designed circuit, such as will be shown with respect to FIGS. 6A-B.

Calibration system 400B comprises comparator 455 and one or more amplifier selection switches 452*b*. Comparator 455 may be located either inside the ATE, or the test load board, or even inside the IC to be tested. Amplifier selection switch 452*b* may be in any one of these locations, or it could be formed by a combination of test probes mounted on a test load board or wafer stepper, or by a pick and place handler for packaged ICs. In this case, the amplifier 451 input is coupled with DAC 452*a* through the equipment's act of placing a die or packaged IC in position for testing, and connecting it to test probes or a test socket.

Calibration controller 456 generates test vectors 547 to define test signal levels generated by DAC 452*a*. Test vectors 547 may also include the control of switch(es) 452*b*. In an alternative embodiment, another source, such as test software running on ATE, could control both the operation of calibration controller 456 and closing and opening of switch(es) 452*b*.

Embodiments such as 400A in FIG. 4A are suited for built-in self-calibration of an IC when it is expected that variations over time, such as aging, supply voltage and current levels, temperature, temperature gradients, and any other environmental conditions, may impact an amplifier's performance. Amplifier 401 could be calibrated on an IC's power up, or wake up from a sleep mode, or at any other time relevant to its operation. Embodiments such as 400B in FIG. 4B are suited for one-time calibration of an amplifier, to compensate for factors that are innate to the production process, such as size differences between devices caused by the photo-lithography process.

Figure 5A:
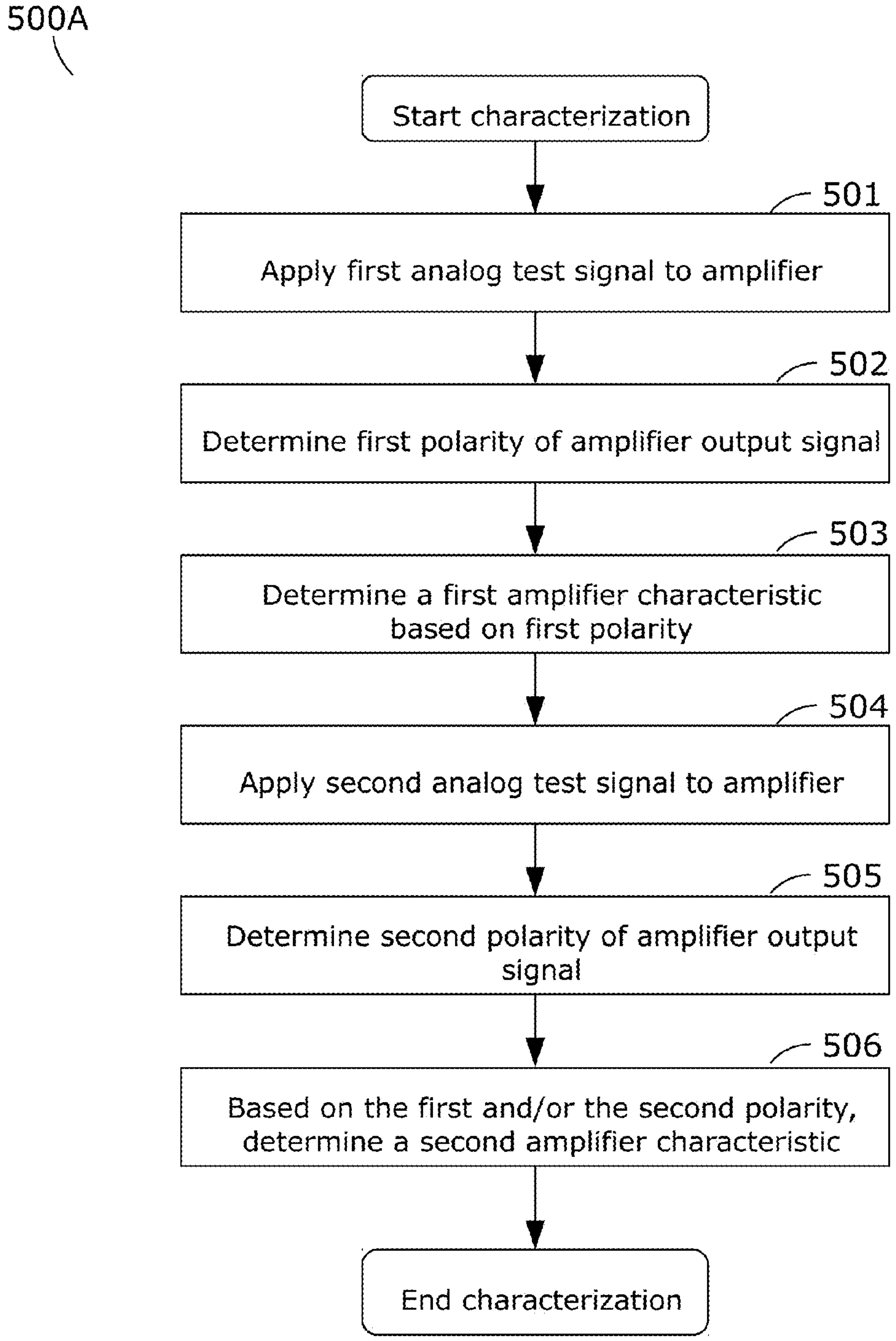
FIGS. 5A-B illustrate methods for amplifier characterization according to embodiments of the invention.
Figure 5B:
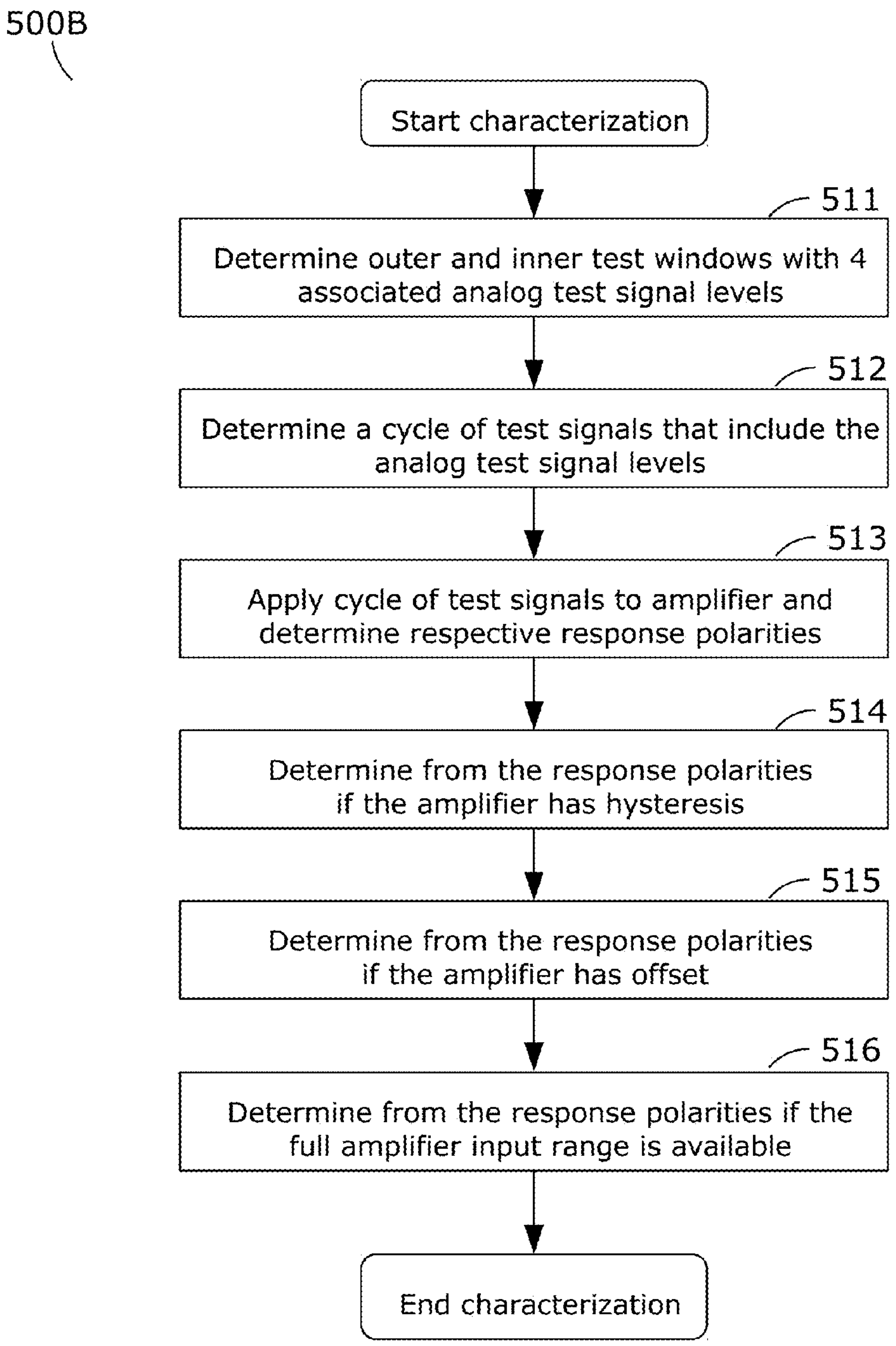

FIGS. 5A-B illustrate methods for amplifier characterization according to embodiments of the invention. With respect to FIG. 5A, method 500A comprises the following steps:

Step 501—applying a first analog test signal to the amplifier. An embodiment generates or retrieves a first test vector; based on the first test vector, it generates a first analog test signal and forwards it to an amplifier input.

Step 502—determining a first polarity of an amplifier output signal. An embodiment determines if in response to the first analog test signal the amplifier produces a positive or negative output signal. If the output signal is positive, the first polarity is positive. If the output signal is negative, the first polarity is negative.

Step 503—based on the first polarity, determining an amplifier characteristic. The characteristic could include, for instance, if a positive offset exists, or a negative offset, etc. An embodiment may store information representing the first polarity. For instance, it may store a bit with value 0 to represent a negative polarity, or a bit with value 1 to represent a positive polarity.

Step 504—applying a second analog test signal to the amplifier. An embodiment generates or retrieves a second test vector; based on the second test vector, it generates a second analog test signal and forwards it to the amplifier input.

Step 505—determining a second polarity of an amplifier output signal. An embodiment determines if in response to the second analog test signal the amplifier produces a positive or negative output signal. If the output signal is positive, the second polarity is positive. If the output signal is negative, the second polarity is negative.

Step 506—based on at least one of the first and second polarities, determining a second amplifier characteristic.

Embodiments of the invention may comprise further steps to obtain further characterization results, such as knowledge about hysteresis, offset, and the availability of the minimum required amplifier input signal range. With respect to FIG. 5B, method 500B includes the following steps:

Step 511—determining an outer test window and an inner test window, where the outer test window corresponds with a minimum required amplifier input signal range, and where the inner test window corresponds with a maximum allowed signal error range. Step 510 further includes determining first through fourth analog test signal levels corresponding with, respectively, the lower end of the outer test window, the lower end of the inner test window, the higher end of the inner test window, the higher end of the outer test window.

Step 512—determining a cycle of successive analog test signals, wherein the cycle includes one of {first, second, third, fourth, third, second} and {fourth, third, second, first, second, third} analog test signal levels, and wherein tests in the cycle are indexed as, for instance, [test A, test B, test C, test D, test E, test F], respectively.

Step 513—forwarding at least part of the cycle of successive analog test signals to the amplifier and determining successive polarities for amplifier output signals in response to the cycle of successive analog test signals.

Step 514—based on at least part of the successive polarities, determining if the amplifier exhibits hysteresis, wherein hysteresis is exposed by unequal polarities in response to test B and test F, and/or unequal polarities in response to test C and test E.

Step 515—based on the successive polarities, determine if the amplifier exhibits offset, wherein offset is exposed by a polarity not matching an expected result in response to both test B and test F, and/or to both test C and test E.

Step 516—based on the successive polarities, determine if the minimum required amplifier input signal range is operational, wherein operation is shown by correct polarities in response to all of tests A and D.

Figure 6A:
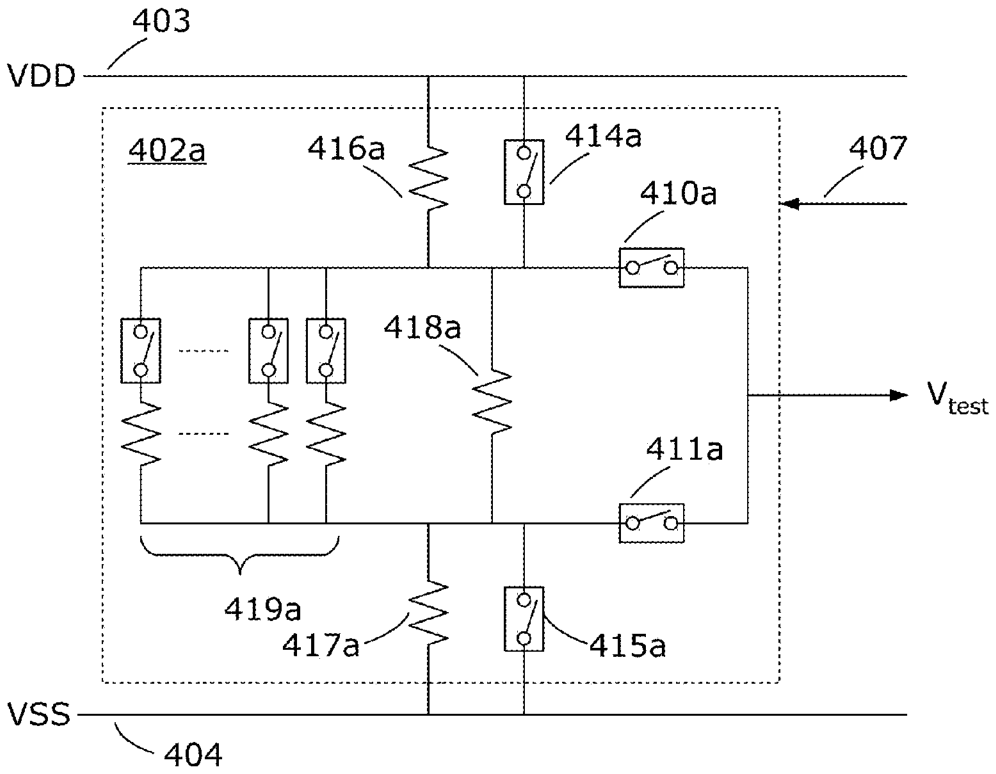
FIGS. 6A-B illustrate example analog test signal generators according to embodiments of the invention.
Figure 6B:
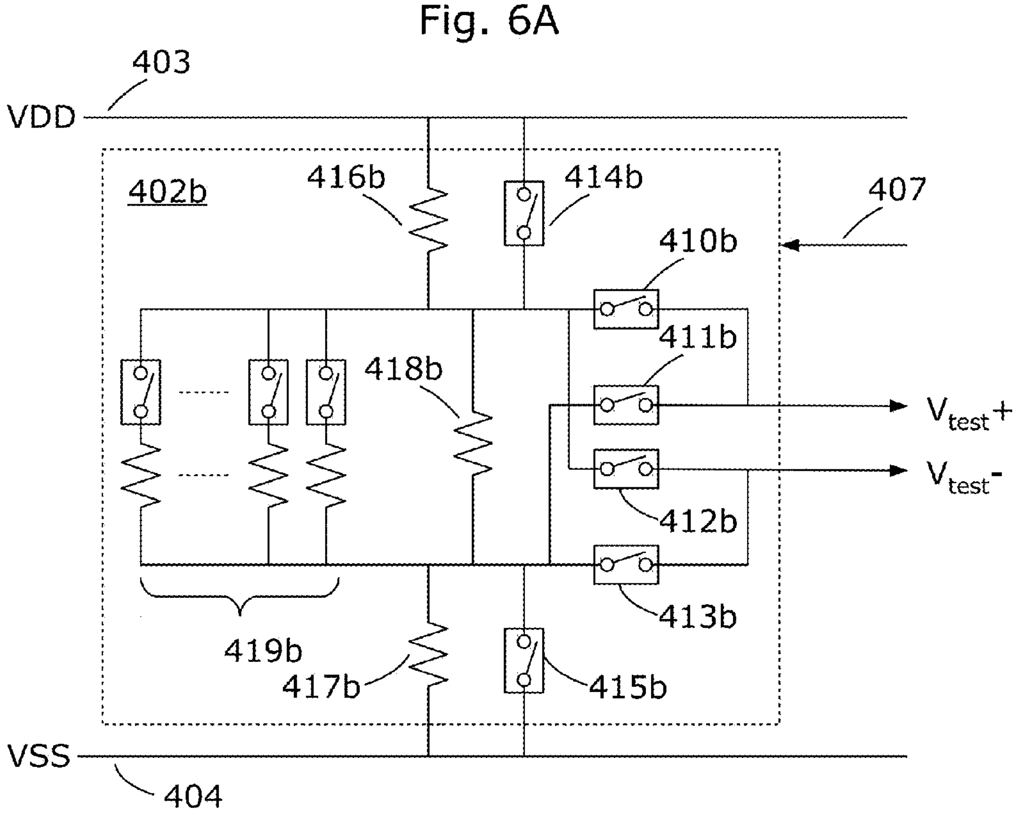

FIG. 6A-B illustrate example analog test signal generators 402*a* and 402*b* according to embodiments of the invention. In particular, it shows an embodiment 402*a* that is capable of generating single-ended test voltages $V_{test}$ and an embodiment 402*b* that is capable of generating differential test voltages on its outputs $V_{test}+$ and $V_{test}-$. Both example embodiments include a non-standard DAC comprising switched resistors, and amplifier selection switches. Alternative embodiments could use a general-purpose DAC in combination with amplifier selection switches. Yet other embodiments could use a non-standard DAC comprising other switched devices, such as switched capacitors.

With reference to analog test signal generator 402*a* in FIG. 6A, amplifier selection switches 410*a* and 411*a* can forward the various test signals to amplifier 401, or shield amplifier 401 from any signals present in analog test signal generator 402*a*. Should a single analog test signal generator 402*a* support multiple amplifiers 401, then for each individual amplifier 401 it may have one set of amplifier selection switches 410*a*-411*a* whose left hand side (as drawn) couples with the analog test signal generator 402*a* and whose right hand side couples with inputs of that individual amplifier 401. Alternatively, an embodiment may include one or more amplifier selection analog multiplexers (not drawn) following a single set of switches 410*a*-411*a*, to provide the test signals to an amplifier 401 being calibrated.

The states of switches 410*a*-415*a*, 416*a*, 417*a* and those in switched resistor array 419*a* are controlled by test vector 407. In general, when a test vector 407 closes a switch, that switch will conduct, and when test vector 407 opens a switch, that switch will not conduct. When test vector 407 opens amplifier selection switches 410*a*-411*a*, an embodiment shields amplifier 401 from any of its internal voltages. When it closes at least either of the amplifier selection switches 410*a* or 411*a*, the embodiment applies a test signal to amplifier 401.

Embodiments control the voltage across resistor 418 through switches 414*a* and 415*a*, and those in switched resistor array 419. For instance, when only switches 414 and 415 are closed, the voltage across resistor 418 equals the supply voltage VDD (403) minus the ground reference VSS (404). The embodiment may output VDD as a test signal by closing amplifier selection switch 410*a*, or it may output VSS as a test signal by closing amplifier selection switch 411*a*.

When all switches 414*a* through 419*a* are open, the voltage across resistor 418*a* is determined by the voltage divider formed by resistors 416*a*, 418*a*, and 417*a*. This makes it possible to output, for example, a voltage close to VDD or close to VSS as a test signal.

When additionally one or more of the switches in switched resistor array 419*a* are closed, the voltage across resistor 418 will decrease accordingly, and any set of desirable voltages may be generated. Embodiments may use equal values for resistors 416*a* and 417*a* or different resistor values. Further embodiments may add one or more switched resistors in parallel with 416*a* and/or 417*a* to make a test window variable. Yet further embodiments may include a switch for resistor 418*a* to limit current when only switches 414*a* and 415*a* are closed.

With reference to analog test signal generator 402*b* in FIG. 6B, amplifier selection switches 410*b*-413*b* can forward the various test signals to amplifier 401, or shield amplifier 401 from any signals present in analog test signal generator 402*b*. Should a single analog test signal generator 402*b* support multiple amplifiers 401, then for each individual amplifier 401 it may have one set of amplifier selection switches 410*b*-413*b* whose left hand side (as drawn) couples with the analog test signal generator 402*b* and whose right hand side couples with inputs of that individual amplifier 401. Alternatively, an embodiment may include one or more amplifier selection analog multiplexers (not drawn) following a single set of switches 410*b*-413*b*, to provide the test signals to an amplifier 401 being calibrated.

The states of switches 410*b*-415*b* and those in switched resistor array 419*b* are fully controlled by test vector 407. In general, when a test vector 407 closes a switch, that switch will conduct, and when test vector 407 opens a switch, that switch will not conduct. When test vector 407 opens amplifier selection switches 410*b*-413*b*, an embodiment shields amplifier 401 from any of its internal voltages. When it closes at least one of the amplifier selection switches 410*b*-413*b*, the embodiment applies a test signal to amplifier 401. In general, an embodiment may close either switches 410*b* and 413*b* to apply a voltage across resistor 418*b* to amplifier 401, or switches 411*b* and 412*b* to apply the reverse of the voltage across resistor 418*b* to amplifier 401.

Embodiments control the voltage across resistor 418*b* through switches 414*b*-415*b* and those in switched resistor array 419. For instance, when only switches 414 and 415 are closed, the voltage across resistor 418 equals the supply voltage VDD (403) minus the ground reference VSS (404). When all switches 414*b*, 415*b* and those in 419*b* are open, the voltage across resistor 418 is determined by the voltage divider formed by resistors 416*b*, 418*b*, and 417*b*. When additionally one or more of the switches in switched resistor array 419*b* are closed, the voltage across resistor 418*b* will decrease accordingly. Embodiments may use equal values for resistors 416*b* and 417*b* to generate a common mode voltage component that is midway between supply voltage VDD (403) and ground reference VSS (404). Other embodiments may use different resistor values to generate lower or higher common mode voltage components. Yet other embodiments may add one or more switched resistors in parallel with 416*b* and/or 417*b* to make the common mode component variable. Further embodiments may include a switch for resistor 418*b* to limit current when only switches 414*b* and 415*b* are closed.

While FIGS. 6A and 6B illustrate a particular order of switches and resistors in each switched resistor combination, a person having ordinary skill in the art will recognize that embodiments may reverse the order in each individual switched resistor combination without loss of functionality, and that other combinations of resistors and switches can generate the same or essentially the same signals.

The embodiments 402*a* and 402*b* of analog test signal generator 402 drawn in FIGS. 6A and 6B have a continuous resistive path from supply voltage VDD (403) to ground reference VSS (404) through resistors 416*a*-418*a*-417*a* and 416*b*-418*b*-417*b*. As a result, current would flow even when the calibration system is not used. Embodiments that need to save power can do so by including a switch anywhere in that resistive path. In that case, when all switches are open, the analog test signal generator 402*a* or 402*b* is in sleep mode, and isolated from amplifier 401.

FIGS. 7A-F illustrate various amplifier characterization cases 700A-700F for differential amplifier input and output voltages handled by embodiments of the invention. Analog test generator 402 generates a cycle of analog test voltages starting with 701, followed upward by 702, 703, and 704, and subsequently downward by 703, 702 and optionally 701. The cycle may also be followed the other way around, beginning at 704, followed by 703, 702, 701, 702, 703 and optionally back to 704. By following either of these two test cycles, embodiments are capable of determining both offset and hysteresis, as will be explained hereunder with reference to the cases in FIGS. 7A-F and the calibration system in FIG. 4. Analog test voltages 701 and 704 may be chosen near the low end and the high end of the range of input signals that amplifier 401 is capable of handling. For instance, for a differential amplifier with rail-to-rail input voltage range, 701 may be chosen to match −VDD and 704 may be chosen to match +VDD.

In cases when testing an input voltage range is not important, analog test voltage 701 may be simply chosen to be lower than 702 and lower than an expected hysteresis, and analog test voltage 704 may be simply chosen to be higher than 703 and higher than an expected hysteresis. Analog test voltages 702 and 703 are small voltages of equal but opposite value defining an inner test window, whose width 703−702 may be adjustable to be able to match an expected offset and/or hysteresis value.

Figure 7A:
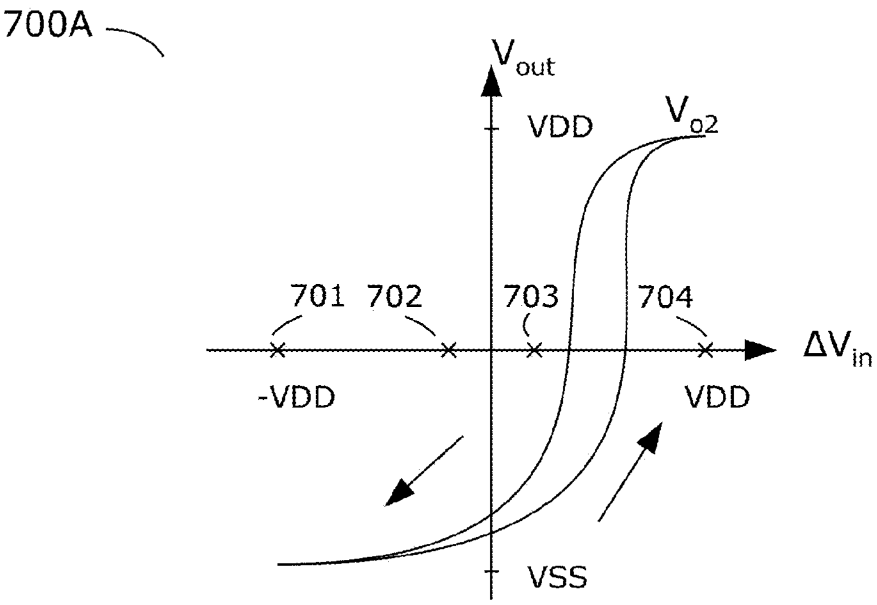
FIGS. 7A-F illustrate various amplifier characterization cases for differential amplifier input and output voltages handled by embodiments of the invention.

FIG. 7A illustrates the case of an amplifier 401 with a large positive offset, and potentially hysteresis. Calibration logic 406 generates a first test vector 407 to generate analog test signal 701, which equals −VDD. It applies this analog test signal to amplifier 401's differential inputs. As a result of the amplifier characteristics 700A shown in FIG. 7A, the amplifier 401 differential output signal Vo2−Vo1 is negative. Comparator 405 determines the polarity of the amplifier 401 differential output signal. It forwards this negative polarity result to the calibration logic 406, which stores it in memory and applies the next test vector 407 for generating analog test signal 702. Again, the comparator 405 result is negative, as is the case for analog test signal 703. Only when calibration logic 406 applies analog test signal 704 is the amplifier 401 differential output signal positive, and comparator 405 result positive. On the way down, upon applying analog test signal 703 already the result is negative. At this point, case 700A can be identified, and the test cycle may be interrupted, or it may be completed to ensure that no invalid measurement results occur. In that case calibration logic 406 may still apply analog test signals 702 and 701, to which the results will both be negative. In summary, comparator 405 results, with N indicating negative polarity and P indicating positive polarity, will be N, N, N, P, N, N, N, successively. Note that these test results indicate a large positive offset, but they are inconclusive about the occurrence of hysteresis.

Embodiments of the invention use the cyclical order of tests to find hysteresis. If a test signal level in the downward part of the cycle yields a different result (typically P) than it had in the upward part (typically N), then there is hysteresis. Embodiments find hysteresis with analog test signals 702 and 703.

Embodiments of the invention may use any part of the cyclical order to find offset. If a response to analog test signal 702 or 703 shows no hysteresis, but the polarity of the result is incorrect, then there is offset. Analog test signal 702 should yield a negative polarity result, and 703 should yield a positive polarity result. If the 702 results have a positive polarity, then an amplifier has negative offset. If the 703 results have a negative polarity, then an amplifier has positive offset.

Embodiments of the invention use analog test signals 701 and 704 as part of the cycle to create a prior state that triggers hysteresis. However, embodiments may also use these analog test signals to test if an amplifier meets its required input signal range.

Figure 7B:
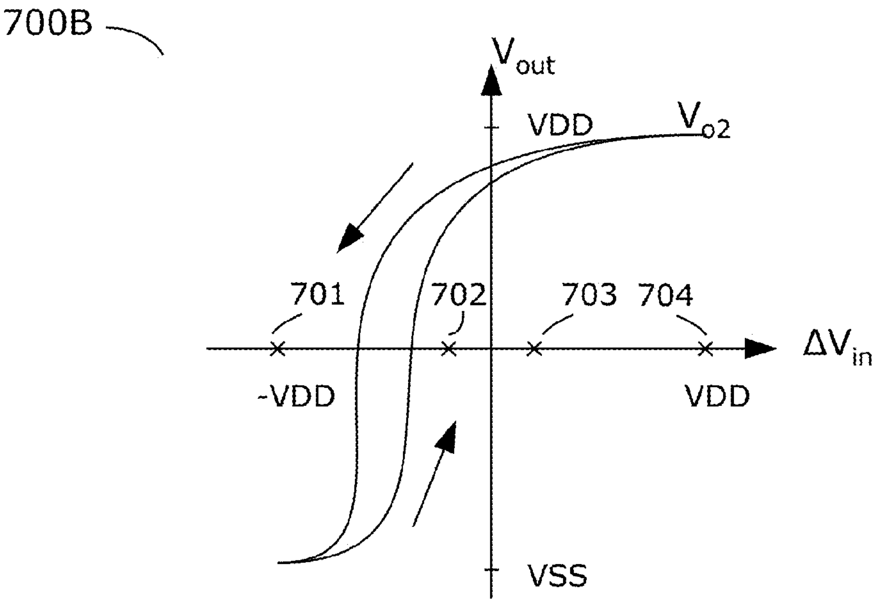

FIG. 7B illustrates the case 700B of an amplifier 401 with hysteresis and a large negative offset. As in the previous case, calibration logic 406 generates successive test vectors 407 for signals 701, 702, 703, 704, 703, 702, and optionally 701. Comparator 405 results will be N, P, P, P, P, P, N, successively. These test results indicate a large negative offset, but they are inconclusive about the occurrence of hysteresis.

Figure 7C:
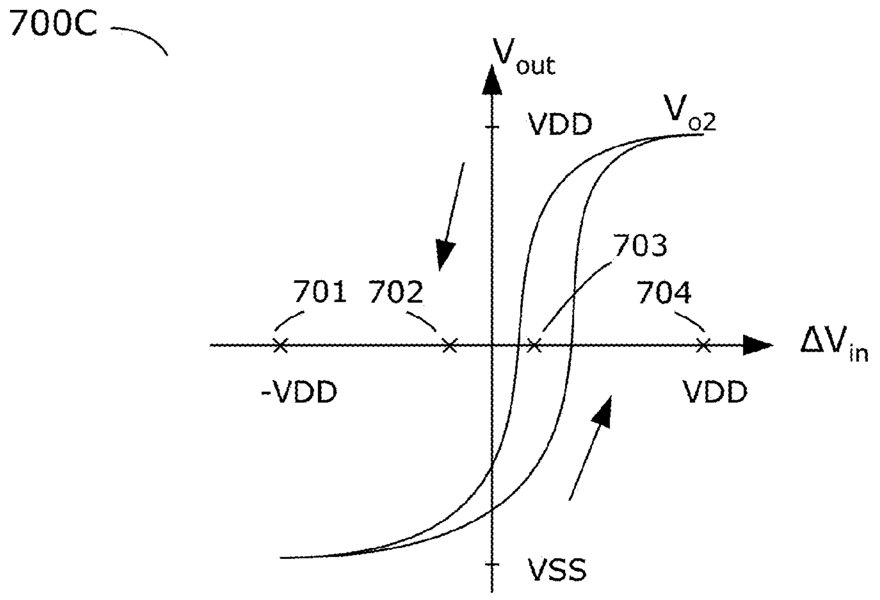

FIG. 7C illustrates the case 700C of an amplifier 401 with hysteresis and some positive offset. Comparator 405 responses to the successive test vectors will be N, N, N, P, P, N, N. These test results indicate at least some positive offset, and at least some hysteresis.

Figure 7D:
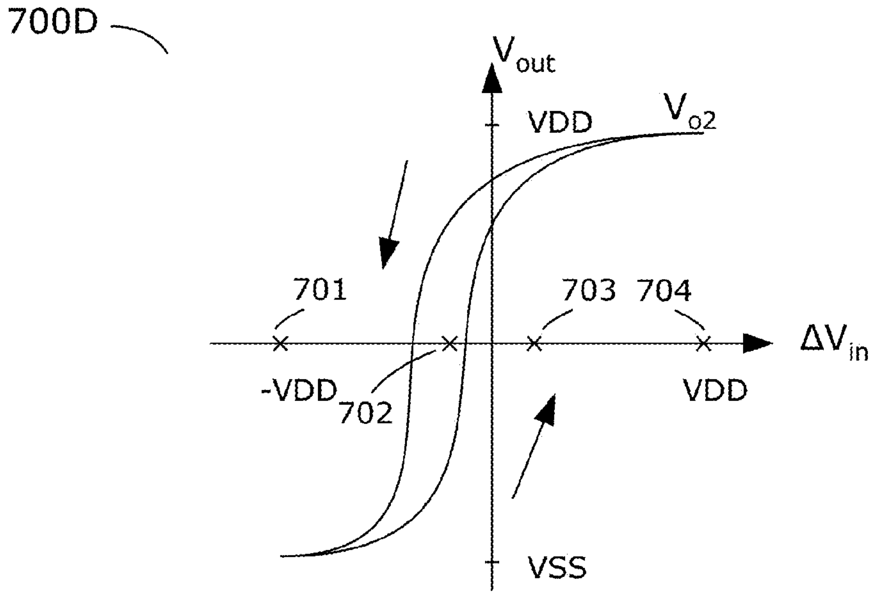

FIG. 7D illustrates the case 700D of an amplifier 401 with hysteresis and some negative offset. Comparator 405 responses to the successive test vectors are N, N, P, P, P, P, N. These test results indicate at least some negative offset, and at least some hysteresis.

Figure 7E:
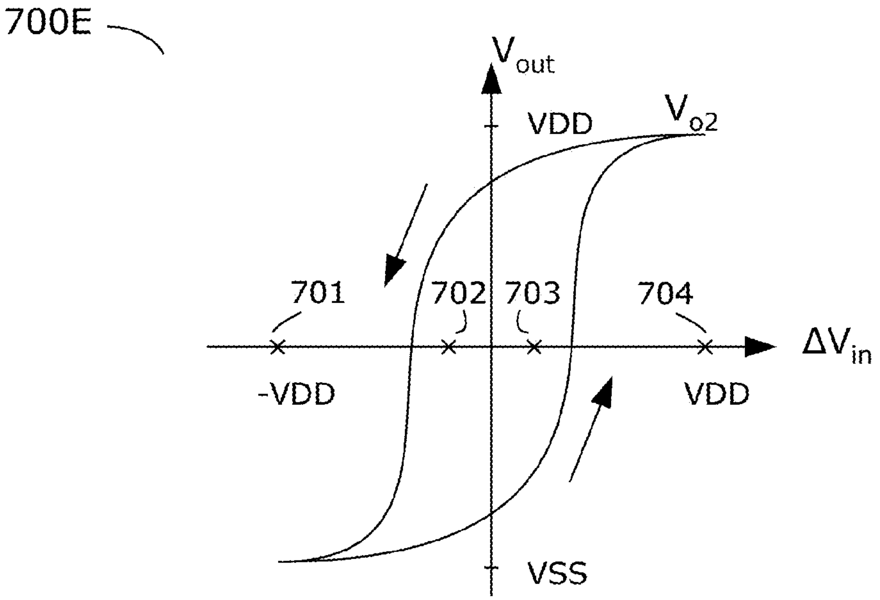

FIG. 7E illustrates the case 700E of an amplifier 401 a large hysteresis, and the possibility of offset with unknown polarity. Comparator 405 responses are N, N, N, P, P, P, N.

Figure 7F:
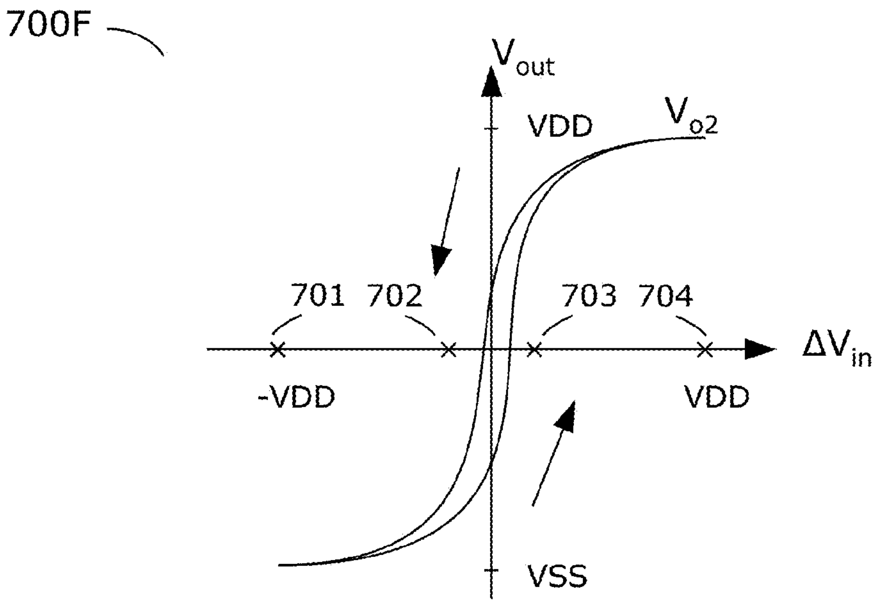

FIG. 7F illustrates the case 700F of an amplifier 401 with little or no hysteresis, and little or no offset. Comparator 405 responses are N, N, P, P, P, N, N.

To determine the amplifier 401 characteristics from the successive comparator 405 responses to the test signals associated with the successive test vectors 701, 702, 703, 704, 703, 702, and 701, calibration logic 406 may simply look up the results in a table, such as the following, in which "N" means negative polarity, "P" means positive polarity, and "d" means don't care:

| 701 | 702 | 703 | 704 | 703 | 702 | 701 | Case | Hysteresis | Offset | Offset Polarity |
|---|---|---|---|---|---|---|---|---|---|---|
| d | d | d | d | N | d | d | 700A | Unknown | Large | Pos |
| d | P | d | d | d | d | d | 700B | Unknown | Large | Neg |
| d | N | N | d | P | N | d | 700C | Yes | Yes | Pos |
| d | N | P | d | P | P | d | 700D | Yes | Yes | Neg |
| d | N | N | d | P | P | d | 700E | Large | Unknown | N/A |
| d | N | P | d | P | N | d | 700F | Small | Small | N/A |

Embodiments of the invention in which the tests are cycled in the order 704, 703, 702, 701, 702, 703, and optionally 704 may use a similar table, with the "don't cares" again appearing in the middle and toward the end of the cycle. As is clear from the table, embodiments need run only six of the seven test vectors to determine the case, as the last test is always "don't care". As mentioned earlier, embodiments may use the "don't care" tests to check for the occurrence of fault conditions.

Whereas we present FIGS. 7A-F in the context of a differential amplifier, all examples are equally valid for amplifiers with single-sided input and/or output signals. In those cases, an amplifier can have positive or negative gain, and expected results may be the inverse from those presented above in the case of an amplifier with negative gain.

Figure 8A:
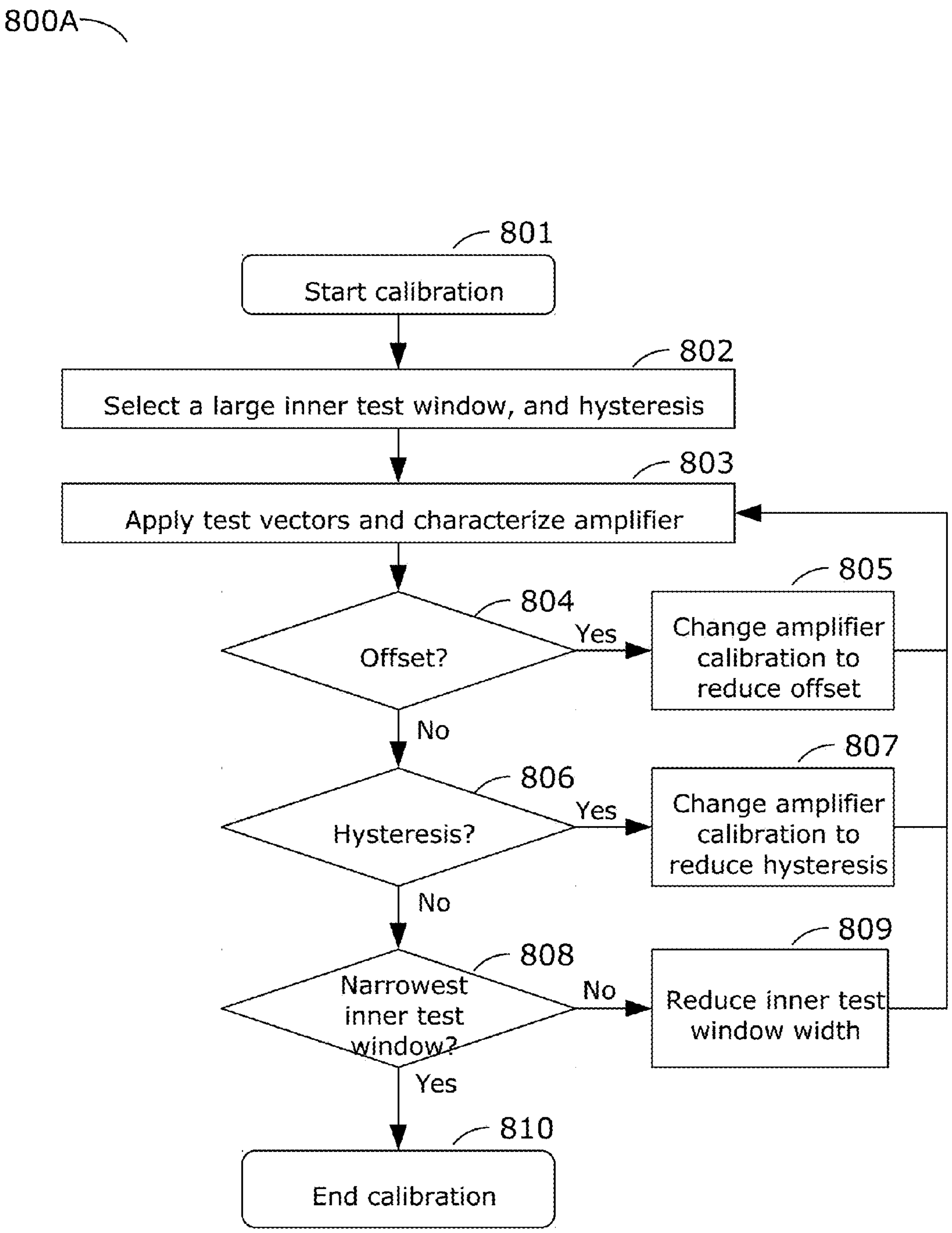
FIGS. 8A-C illustrate example amplifier calibration methods according to embodiments of the invention.
Figure 8B:
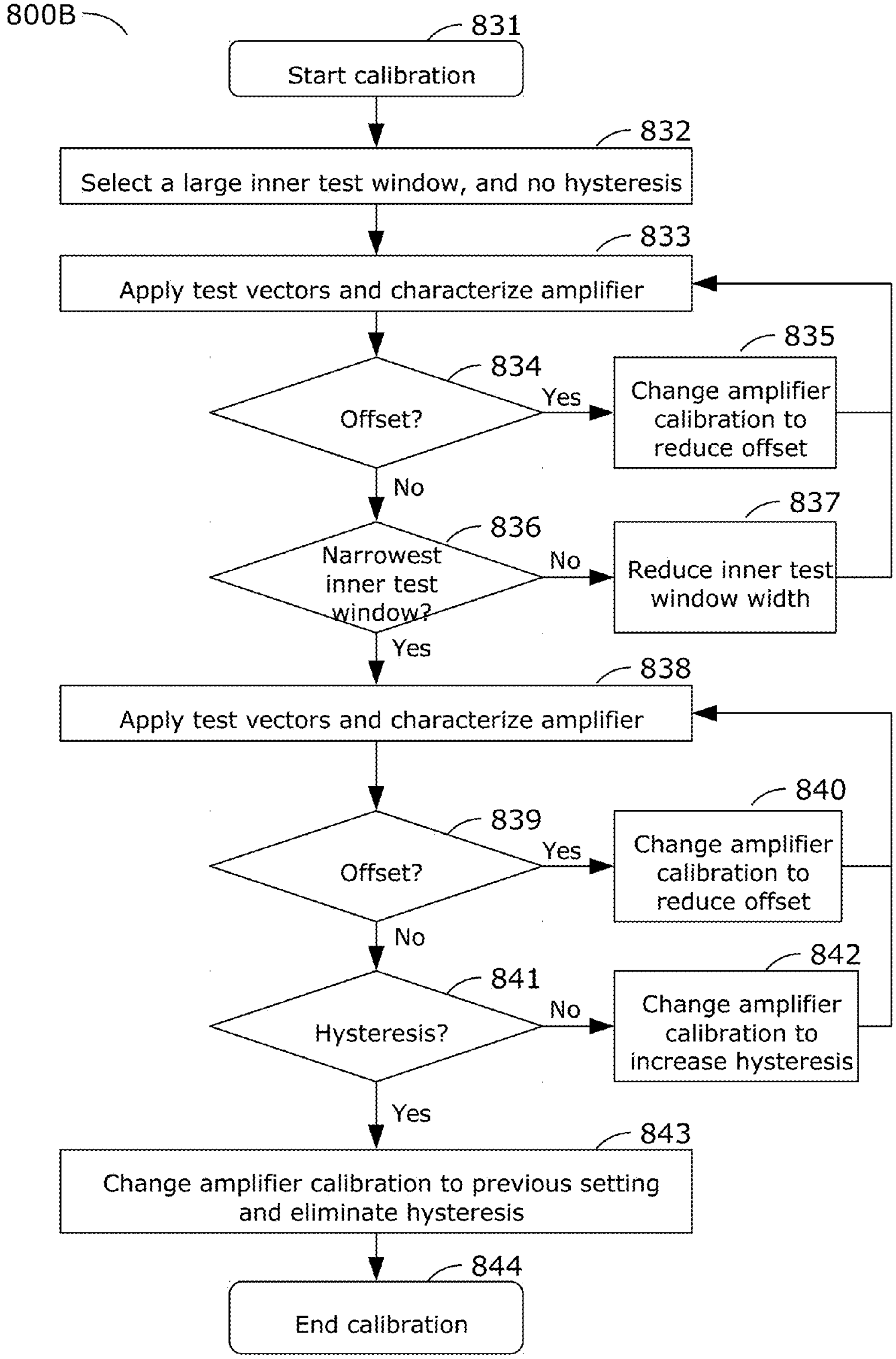
Figure 8C:
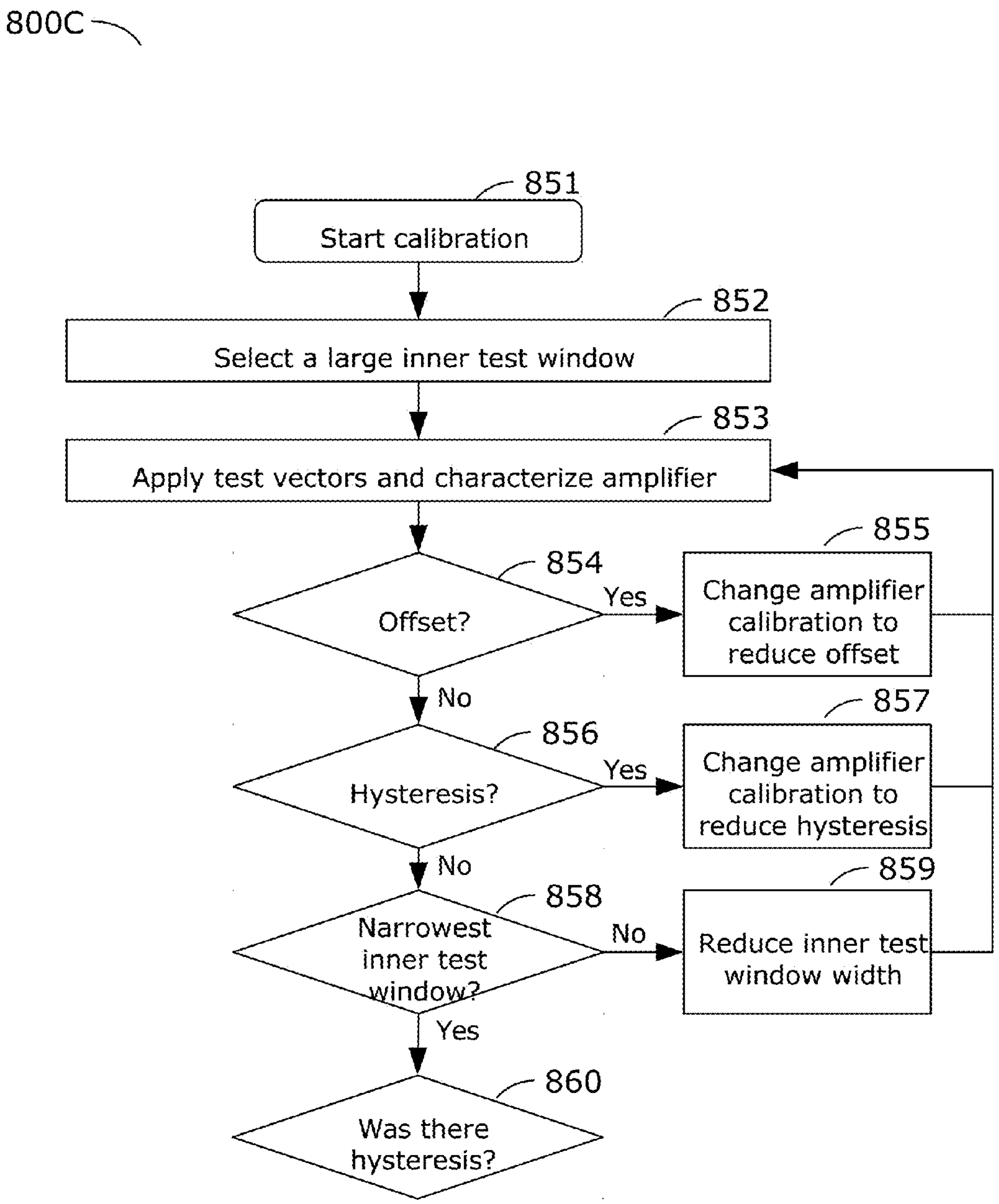
Figure 8C:
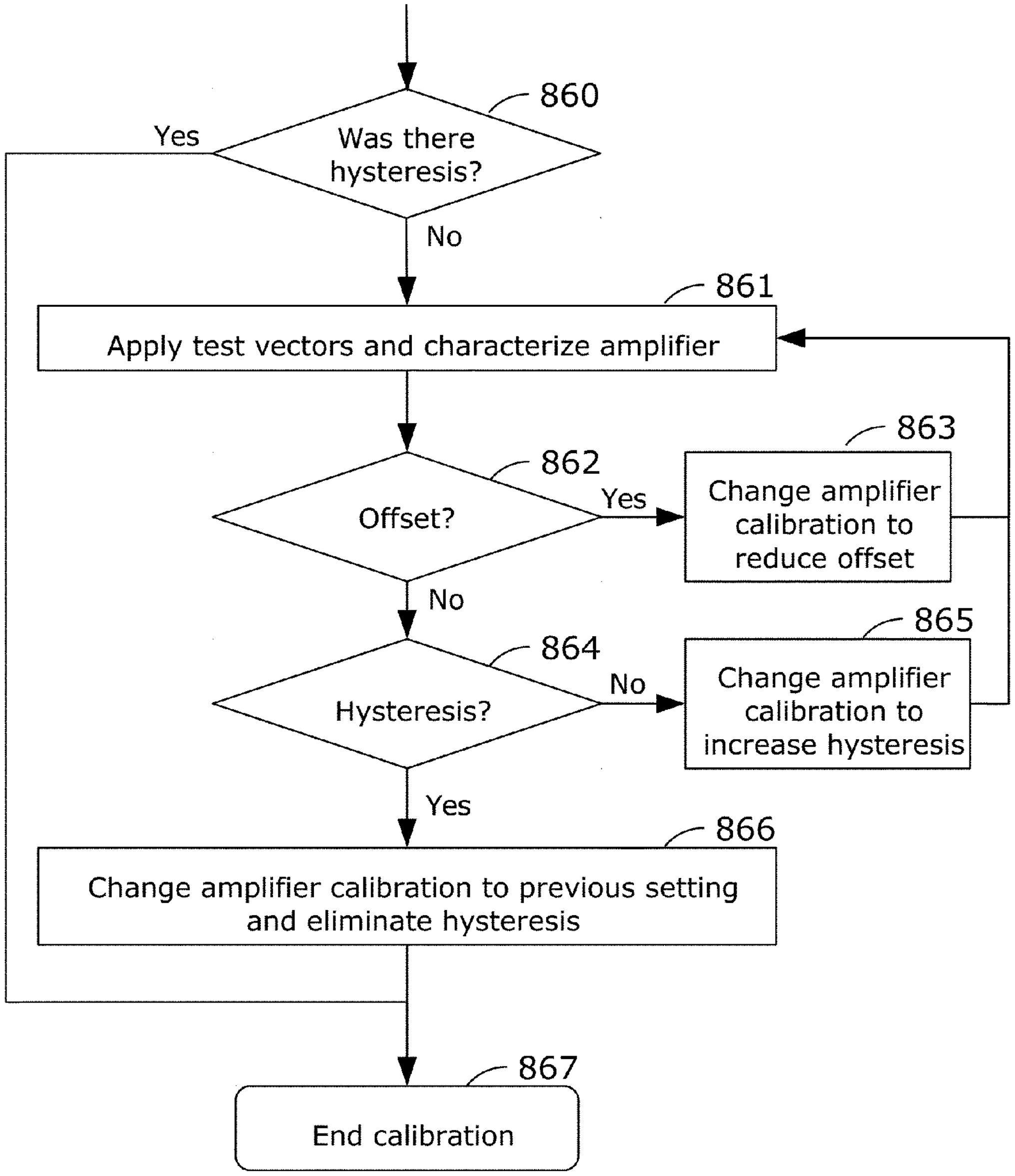

FIGS. 8A-C illustrate example amplifier calibration methods 800A-800C according to embodiments of the invention. In the case of calibrating an amplifier with positive feedback, the methods are useful for maximizing the gain by operating the amplifier at the point just before where hysteresis occurs. With reference to FIGS. 7 and 6B, these embodiments methods 800A-800C vary the inner test window width 703–702. The inner test window is at its largest when all switches in 419 are open. The inner test window width is then set by the ratio of resistors 416*b*, 418*b*, and 417*b*. When any of the switches in 419 are closed, resistors in 419 are switched parallel to resistor 418*b*, decreasing the voltage across it, and thereby decreasing the inner test window width 703–702. The example method 800A starts with the amplifier preset to have hysteresis, and it gradually changes parameters toward the point where hysteresis disappears. The example method 800B starts with the amplifier preset to no hysteresis, and then gradually changes parameters toward the point where hysteresis occurs. In an amplifier with positive feedback, these parameters would usually be associated with gain too. This could increase the sensitivity to offset, which therefore needs to be kept in check. The example method 800C does not preset the amplifier to either have hysteresis or no hysteresis.

With reference to FIG. 8A, the example amplifier calibration method 800A includes the next steps, following step 801, which labels the start of the calibration process.

Step 802—selecting a large width for an inner test window 703–702 and presetting the amplifier to show hysteresis.

Step 803—applying a series of test vectors that generate a cycle of analog test signals that are forwarded to the amplifier's inputs. The cycle may include a test signal at the lowest end 701 of the amplifier input voltage range, followed by the low end 702 of the inner test window, then the high end 703 of the inner test window, then the high end 704 of the amplifier input voltage range, then back to the high end 703 of the inner test window, its low end 702, and optionally the lowest end 701 of the amplifier input voltage range. Step 803 further includes determining a polarity of an output signal of the amplifier in response to each analog test signal, and, based on the successively measured polarities, characterizing the amplifier. Step 803 may distinguish among several amplifier characteristics, such as for instance large positive offset, small positive offset, small negative offset, large negative offset, hysteresis detected, and no hysteresis detected.

Step 804—determining if the amplifier characteristics include offset.

Step 805—in response to determining that the amplifier characteristics include offset, changing the amplifier calibration to reduce offset. For instance, if the amplifier characteristics include a large offset, embodiments may make a coarse change in the amplifier calibration settings. If they include a small offset, embodiments may make a fine change in the amplifier calibration settings. A positive offset may require a change in calibration one way, whereas a negative offset may require a change in calibration another way. After step 805, embodiments repeat steps 803 and 804.

Step 806—in response to determining that the amplifier characteristics don't include offset, determining if the amplifier characteristics include hysteresis.

Step 807—in response to determining that the amplifier characteristics include hysteresis, changing the amplifier calibration to reduce hysteresis. After step 807, embodiments repeat steps 803-806.

Step 808—in response to determining that the amplifier characteristics don't include hysteresis, determining if the narrowest inner test window width 703–702 is used.

Step 809—in response to determining that inner test window width 703–702 is not at its narrowest, reducing inner test window width 703–702. After step 809, embodiments repeat steps 803-808.

Step 810—in response to determining that inner test window width 703–702 is at its narrowest, ending the calibration procedure. Embodiments may isolate the calibrated amplifier from an analog test signal generator.

The above example embodiment tests offset first (step 804) and hysteresis later (step 806). Alternative embodiments may reverse this order. They may determine and adjust hysteresis first, then determine and adjust offset, followed by determining if the narrowest width inner test window is used.

With reference to FIG. 8B, the example amplifier calibration method 800B includes the next steps, following step 831, which labels the start of the calibration process.

Step 832—selecting a large width for an inner test window 703–702 and presetting the amplifier to show no hysteresis.

Step 833—applying a series of test vectors that generate a cycle of analog test signals that are forwarded to the amplifier's inputs. The cycle may include a test signal at the lowest end 701 of the amplifier input voltage range, followed by the low end 702 of the inner test window, then the high end 703 of the inner test window, then the high end 704 of the amplifier input voltage range, then back to the high end 703 of the inner test window, its low end 702, and optionally the lowest end 701 of the amplifier input voltage range. Step 833 further includes determining a polarity of an output signal of the amplifier in response to each analog test signal, and, based on the successively measured polarities, characterizing the amplifier. Step 833 may distinguish among several amplifier characteristics, such as for instance large positive offset, small positive offset, small negative offset, large negative offset, hysteresis detected, and no hysteresis detected.

Step 834—determining if the amplifier characteristics include offset.

Step 835—in response to determining that the amplifier characteristics include offset, changing the amplifier calibration to reduce offset. For instance, if the amplifier characteristics include a large offset, embodiments may make a coarse change in the amplifier calibration settings. If they include a small offset, embodiments may make a fine change in the amplifier calibration settings. A positive offset may require a change in calibration one way, whereas a negative offset may require a change in calibration another way. After step 835, embodiments repeat steps 833 and 834.

Step 836—in response to determining that the amplifier characteristics don't include offset, determining if the narrowest inner test window width 703–702 is used.

Step 837—in response to determining that inner test window width 703–702 is not at its narrowest, reducing inner test window width 703–702. After step 837, embodiments repeat steps 833-836.

Step 838—in response to determining that inner test window width 703–702 is at its narrowest, re-applying the series of test vectors that generate a cycle of analog test signals that are forwarded to the amplifier's inputs, and characterizing the amplifier to determine updated amplifier characteristics. Step 838 may be a repeat of step 833.

Step 839—determining if the updated amplifier characteristics include offset.

Step 840—in response to determining that the updated amplifier characteristics include offset, changing the amplifier calibration to reduce offset. After step 840, embodiments repeat steps 838 and 839.

Step 841—in response to determining that the updated amplifier characteristics don't include offset, determining if the updated amplifier characteristics include hysteresis.

Step 842—in response to determining that the updated amplifier characteristics don't include hysteresis, changing the amplifier calibration to increase hysteresis. After step 842, embodiments repeat steps 838-841.

Step 843—in response to determining that the updated amplifier characteristics include hysteresis, changing amplifier calibration to a previous setting, and eliminating hysteresis.

Step 844—end of the calibration procedure. Embodiments may isolate the calibrated amplifier from an analog test signal generator.

Embodiments may introduce additional steps into methods 800A or 800B to further reduce hysteresis and/or offset by a fixed step. The methods 800A and 800B force these characteristics to be smaller than the width of inner test window 703–702. However, a small amount may remain. For applications not allowing this, and given knowledge of a specific amplifier under calibrations, embodiments may apply a fixed reduction in the hysteresis and/or offset to guarantee its elimination.

With reference to FIG. 8C, the example amplifier calibration method 800C includes the next steps, following step 851, which labels the start of the calibration process.

Step 852—selecting a large width for an inner test window 703–702. This example embodiment method 800C needs no presetting of hysteresis parameters.

Step 853—applying a series of test vectors that generate a cycle of analog test signals that are forwarded to the amplifier's inputs. The cycle may include a test signal at the lowest end 701 of the amplifier input voltage range, followed by the low end 702 of the inner test window, then the high end 703 of the inner test window, then the high end 704 of the amplifier input voltage range, then back to the high end 703 of the inner test window, its low end 702, and optionally the lowest end 701 of the amplifier input voltage range. Step 803 further includes determining a polarity of an output signal of the amplifier in response to each analog test signal, and, based on the successively measured polarities, characterizing the amplifier. Step 803 may distinguish among several amplifier characteristics, such as for instance large positive offset, small positive offset, small negative offset, large negative offset, hysteresis detected, and no hysteresis detected.

Step 854—determining if the amplifier characteristics include offset.

Step 855—in response to determining that the amplifier characteristics include offset, changing the amplifier calibration to reduce offset. For instance, if the amplifier characteristics include a large offset, embodiments may make a coarse change in the amplifier calibration settings. If they include a small offset, embodiments may make a fine change in the amplifier calibration settings. A positive offset may require a change in calibration one way, whereas a negative offset may require a change in calibration another way. After step 855, embodiments repeat steps 853 and 854.

Step 856—in response to determining that the amplifier characteristics don't include offset, determining if the amplifier characteristics include hysteresis.

Step 857—in response to determining that the amplifier characteristics include hysteresis, changing the amplifier calibration to reduce hysteresis and setting a memory flag to indicate that the amplifier has had hysteresis. After step 857, embodiments repeat steps 853-856.

Step 858—in response to determining that the amplifier characteristics don't include hysteresis, determining if the narrowest inner test window width 703–702 is used.

Step 859—in response to determining that inner test window width 703-702 is not at its narrowest, reducing inner test window width 703-702. After step 859, embodiments repeat steps 853-858.

Step 860—in response to determining that inner test window width 703-702 is at its narrowest, determining if the memory flag has been set to indicate that the amplifier has had hysteresis. In response to determining that the memory flag has not been set, proceeding to step 867 to end calibration.

Step 861—in response to determining that that the memory flag has not been set, re-applying the series of test vectors that generate a cycle of analog test signals that are forwarded to the amplifier's inputs, and characterizing the amplifier to determine updated amplifier characteristics. Step 861 may be a repeat of step 853.

Step 862—determining if the updated amplifier characteristics include offset.

Step 863—in response to determining that the updated amplifier characteristics include offset, changing the amplifier calibration to reduce offset. After step 863, embodiments repeat steps 861 and 862.

Step 864—in response to determining that the updated amplifier characteristics don't include offset, determining if the updated amplifier characteristics include hysteresis.

Step 865—in response to determining that the updated amplifier characteristics don't include hysteresis, changing the amplifier calibration to increase hysteresis. After step 865, embodiments repeat steps 861-864.

Step 866—in response to determining that the updated amplifier characteristics include hysteresis, changing amplifier calibration to a previous setting, and eliminating hysteresis.

Step 867—end of the calibration procedure. Embodiments may isolate the calibrated amplifier from an analog test signal generator.

Figure 9:
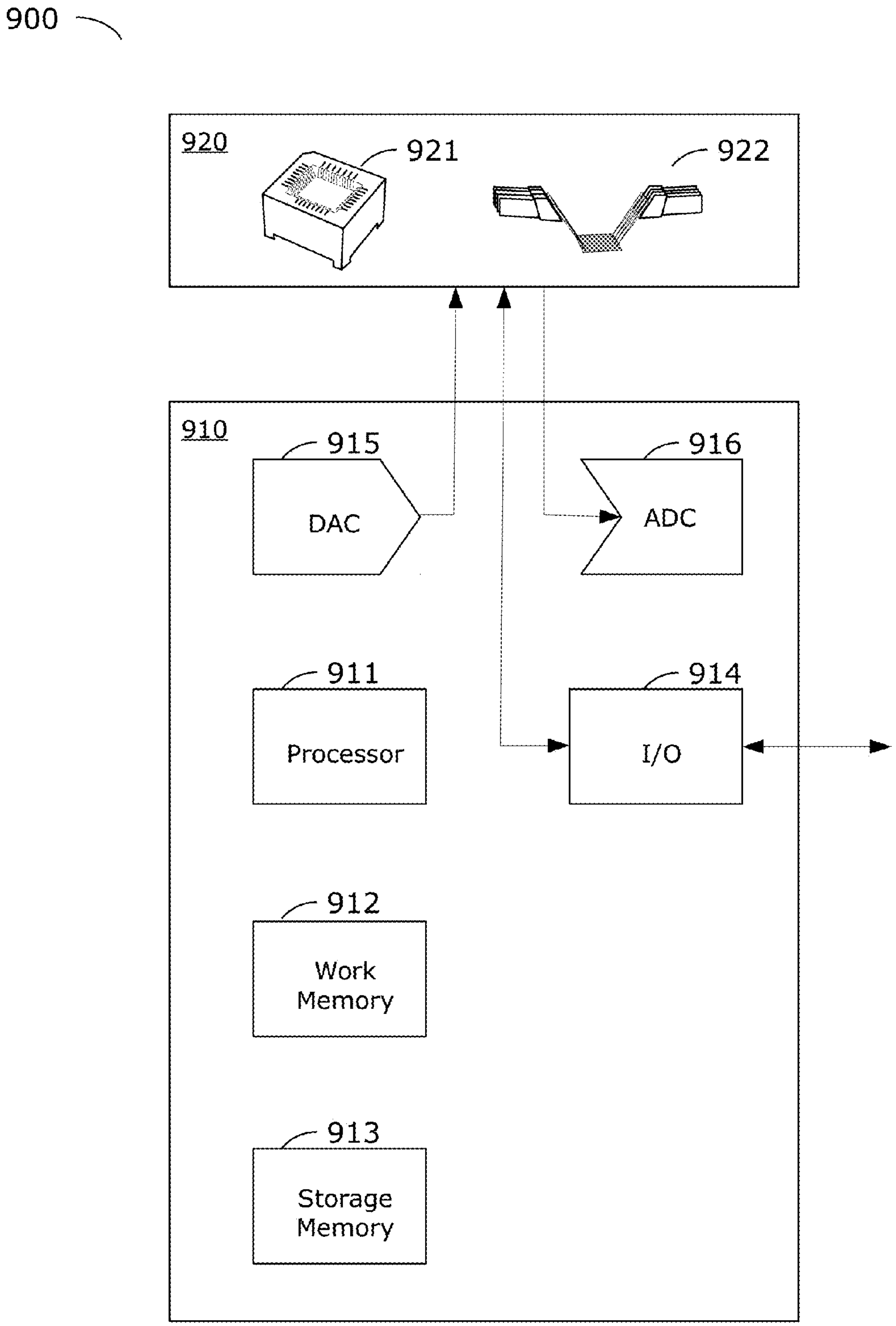
FIG. 9 illustrates an example system 900 capable of characterizing and calibrating an electronic circuit, such as an amplifier, according to embodiments of the invention.

FIG. 9 illustrates an example system 900 capable of characterizing and calibrating an electronic circuit, such as an amplifier, according to embodiments of the invention. The system 900 includes IC tester 910, which may include automated test equipment (ATE) as known in the art, or which may include a general-purpose computer as known in the art; and IC interface board 920, which may include a custom-built test load board as known in the art, or which may include a breadboard or IC evaluation board.

IC tester 910 includes one or more processors 911, capable of and configured for executing software implementing any of the methods described herein; tangible work memory 912, such as random-access memory (RAM), which may be suitable to hold instructions and data being processed; storage memory 913, such as ROM, Flash, magnetic disks, optical disks, and any other tangible data storage devices capable of holding instructions and/or data when no supply voltage is available; input/output (I/O) devices 914, such as a keyboard, a mouse, a touchpad, a touchscreen, a display monitor, a loudspeaker, a microphone, a serial communications port such as Ethernet or the universal serial bus (USB), a parallel communications port, a wireless transceiver such as WiFi, or any other computer interface known in the art. Embodiments may further include a digital-to-analog converter (DAC) 915 and/or an analog-to-digital converter (ADC) 916.

IC interface board 920 may include a printed circuit board (PCB) to which an IC including the electronic circuit is permanently attached; and/or it may include a socket 921 that allows temporary insertion of an IC including the electronic circuit; and/or it may include one or more wafer probes 922 capable of electrically coupling an electric signal with a naked IC die that includes the electronic circuit. Embodiments may further include a DAC and/or an ADC.

Storage memory 913 may include software with instructions for carrying out any of the methods described herein. Embodiments pass the instructions on to processor 911 for execution. Processor 911 executes the instructions and may use DAC 915 or any general-purpose or special-purpose DAC included in IC interface board 920 to apply test signals to the electronic circuit. Processor 911 may use ADC 916 or any general-purpose or special-purpose ADC included in IC interface board 920 to measure responses from the electronic circuit.

Although the description has been described with respect to particular embodiments thereof, these particular embodiments are merely illustrative, and not restrictive. For example, embodiments may add test voltages to test additional parameters that may be relevant for a particular amplifier, or embodiments may generate analog test signals other than voltages for amplifiers that have inputs other than voltage inputs. Similarly, the example methods focus on reducing offset and hysteresis, whereas with or without minor adjustments they can equally well be applied to control a wide range of other amplifier characteristics. Further, the example methods focus on calibrating amplifiers, whereas other circuits, including but not limited to comparators, can be calibrated using the same circuits and methods presented herein. All such variations and modifications are to be considered within the ambit of the present invention the nature of which is to be determined from the foregoing description.

It will be understood that the invention disclosed and defined in this specification extends to all alternative combinations of two or more of the individual features mentioned or evident from the text or drawings. All of these different combinations constitute various alternative aspects of the invention.

Although the description has been described with respect to particular embodiments thereof, these particular embodiments are merely illustrative, and not restrictive.

Any suitable technology for manufacturing electronic devices can be used to implement the circuits of particular embodiments, including bipolar, JFET, MOS, NMOS, PMOS, CMOS, BiCMOS, HBT, MESFET, FinFET, etc. Different semiconductor materials can be employed, such as silicon, germanium, SiGe, GaAs, InP, graphene, etc. Circuits may have single-ended or differential inputs, and single-ended or differential outputs. Terminals to circuits may function as inputs, outputs, both, or be in a high-impedance state, or they may function to receive supply power, a ground reference, a reference voltage, a reference current, or other. Although the physical processing of signals may be presented in a specific order, this order may be changed in different particular embodiments. In some particular embodiments, multiple elements, devices, or circuits shown as sequential in this specification can be operating in parallel.

Particular embodiments may be implemented in a computer-readable storage medium for use by or in connection with an instruction execution system, apparatus, system, or device. Particular embodiments can be implemented in the form of control logic in software, firmware, hardware or a combination of those. The control logic, when executed by one or more processors, may be operable to perform that which is described in particular embodiments. For example, a tangible medium such as a hardware storage device can be used to store the control logic, which can include executable instructions.

It will also be appreciated that one or more of the elements depicted in the drawings/figures can also be implemented in a more separated or integrated manner, or even removed or rendered as inoperable in certain cases, as is useful in accordance with a particular application. It is also within the spirit and scope to implement a program or code that can be stored in a machine-readable medium to permit a computer to perform any of the methods described above.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

Thus, while particular embodiments have been described herein, latitudes of modification, various changes, and substitutions are intended in the foregoing disclosures, and it will be appreciated that in some instances some features of particular embodiments will be employed without a corresponding use of other features without departing from the scope and spirit as set forth. Therefore, many modifications may be made to adapt a particular situation or material to the essential scope and spirit.

We claim:

1. A system for calibrating an amplifier comprising:

a comparator;

a calibration controller having:

an input coupled with a comparator output, a calibration data output, a test vector output; and an analog test signal generator with a test vector input coupled with the calibration controller test vector output, wherein the analog test signal generator is configured to generate analog test signals based on test vectors received from the calibration controller, and wherein the analog test signal generator comprises:

a digital-to-analog-converter (DAC) with an input coupled with the test vector input, and with an output; and one or more amplifier selection switches coupled with the DAC output.

2. The system of claim 1, wherein the calibration controller is configured to at least one of generate and retrieve a series of test vectors to generate a cycle of analog test signals, wherein the cycle comprises an upward path and a downward path, with a lowest level analog test signal included in the upward path, a highest level analog test signal included in the downward path, and a lower medium level and a higher medium level analog test signal each included in both the upward and downward paths.

3. The system of claim 1, wherein:

a comparator input is coupled with an amplifier output;

an analog test signal generator output is coupled with an amplifier input; and an amplifier calibration data input is coupled with the calibration controller calibration data output.

4. The system of claim 1, wherein the analog test signals include test voltages.

5. The system of claim 1, wherein the analog test signals include test currents.

6. The system of claim 1, wherein the analog test signal generator has a predetermined output impedance that is independent of test signal levels.

7. The system of claim 1, wherein the analog test signals include a quantity other than voltage, current, and power.

8. The system of claim 1, wherein the analog test signal generator comprises:

a first test signal output;

a first switch, with an output coupled to the first test signal output, and with a control terminal coupled with the test vector input and configured to be controlled by at least a part of a test vector received from the calibration controller; and two or more resistors coupled in series between a supply voltage and a ground reference, wherein two of the two or more resistors are coupled with a first switch input.

9. The system of claim 8, wherein the analog test signal generator further comprises:

one or more switched resistors, each having a switch with a control terminal coupled with the test vector input and configured to be controlled by at least a part of a test vector received from the calibration controller, wherein at least one of:

the one or more switched resistors comprise a resistor in series with the switch, and are coupled in parallel with a first of the two or more resistors coupled in series between the supply voltage and the ground reference; and the one or more switched resistors comprise a resistor in parallel with the switch, and are coupled in series with a first of the two or more resistors coupled in series between the supply voltage and the ground reference.

10. The system of claim 9, wherein the analog test signal generator further comprises:

a switch in parallel with a second of the two or more resistors coupled in series between the supply voltage and the ground reference, the switch having a control terminal coupled with the test vector input and configured to be controlled by at least a part of a test vector received from the calibration controller.

11. A method for characterizing an electronic circuit, comprising:

generating or retrieving a first test vector;

based on the first test vector, generating a first analog test signal;

forwarding the first analog test signal to an electronic circuit input;

determining a first polarity of an output signal of the electronic circuit, based on a first electronic circuit response to the first analog test signal; and based on the first polarity, determining an electronic circuit characteristic;

generating or retrieving a second test vector;

based on the second test vector, generating a second analog test signal, wherein a second analog test signal level is higher than a first analog test signal level;

forwarding the second analog test signal to the electronic circuit input;

determining a second polarity of an output signal of the electronic circuit, based on a second electronic circuit response to the second analog test signal;

based on the first and second polarities, determining an electronic circuit offset characteristic:

generating or retrieving a third and a fourth test vector;

based on the third and fourth vectors, generating third and fourth analog test signals, wherein a third analog test signal level is lower than the first analog test signal level and a fourth analog test signal level is higher than the second analog test signal level;

forwarding the first through fourth analog test signals to the electronic circuit input in at least part of a cyclic order;

determining a series of polarities of output signals of the electronic circuit, based on electronic circuit responses to the first through fourth analog test signals in the at least part of the cyclic order; and based on at least a part of the series of polarities, determining an electronic circuit hysteresis characteristic.

12. The method of claim 11, further comprising:

based on at least a part of the series of polarities, determining a first electronic circuit input range characteristic.

13. The method of claim 12, further comprising:

based on at least a part of the series of polarities, determining a second electronic circuit input range characteristic.

14. The method of claim 11, wherein the cyclic order includes:

the third, the first, the second, the fourth, the second, and the first analog test signals, respectively.

15. The method of claim 11, wherein the cyclic order includes:

the fourth, the second, the first, the third, the first, and the second analog test signals, respectively.

16. The method of claim 11, wherein the electronic circuit hysteresis characteristic is determined based on successive polarities in the series of polarities, wherein the successive polarities indicate different successive electronic circuit responses to at least one of the first analog test signal and the second analog test signal.

17. The method of claim 11, wherein an electronic circuit offset characteristic is determined based on successive polarities in the series of polarities, wherein the successive polarities indicate wrong electronic circuit responses to at least one of the first and the second analog test signal.

18. A method for calibrating an electronic circuit, comprising the following steps:

forwarding a series of analog test signals to an electronic circuit input, wherein the series includes an upward cycle and a downward cycle of analog test signals, wherein the analog test signals include a first, a second, a third and a fourth analog test level, wherein the second analog test level is associated with a low adjustable inner test window initial value, the third analog test level is associated with a high adjustable inner test window initial value, the first analog test level is lower than the second analog test level, and the fourth analog test level is higher than the third analog test level;

determining polarities of a series of electronic circuit responses to the series of analog test signals;

based on the polarities, determining one or more electronic circuit characteristics;

determining if an electronic circuit characteristic is acceptable; and in response to determining that the electronic circuit characteristic is not acceptable, changing an electronic circuit calibration parameter in response to determining that the electronic circuit characteristic is acceptable:

adjusting at least one of the analog test signals to obtain an adjusted series of analog test signals;

forwarding the adjusted series of analog test signals to the electronic circuit input;

determining updated polarities of a series of electronic circuit responses to the adjusted series of analog test signals;

based on the updated polarities, determining one or more adjusted electronic circuit characteristics; and determining if an adjusted electronic circuit characteristic is acceptable generating first through sixth test vectors associated with the first through fourth analog test levels, wherein the first and fourth test vectors are each associated with one of the first and fourth analog test levels, and wherein the second and sixth test vectors are both associated with the same one of the second and third analog test levels, and wherein the third and the fifth test vectors are both associated with the same other of the second and third analog test levels; and using the first through sixth test vectors, respectively, to generate the series of analog test signals, each analog test signal corresponding with the analog test level associated with the respective test vector.

19. The method of claim 18, further comprising:

determining if the electronic circuit characteristics include offset;

in response to determining that the electronic circuit characteristics include offset, changing an electronic circuit calibration parameter to reduce offset;

determining if the inner test window can be narrowed; and in response to determining that the inner test window can be narrowed, narrowing the second and third analog test levels for the low and high values of the adjustable inner test window, and updating test vectors associated with the second and third analog test levels to narrow the inner test window.

20. The method of claim 19, further comprising presetting an electronic circuit calibration parameter to a value for which the electronic circuit is expected to show hysteresis.

21. The method of claim 19, further comprising presetting an electronic circuit calibration parameter to a value for which the electronic circuit is expected to show no hysteresis.

22. The method of claim 19, further comprising:

determining if the electronic circuit characteristics include hysteresis; and in response to determining that the electronic circuit characteristics include hysteresis, changing an electronic circuit calibration parameter to reduce hysteresis, and re-characterizing the electronic circuit.

23. The method of claim 22, further comprising:

in response to determining that the electronic circuit characteristics include hysteresis, setting a memory flag.

24. The method of claim 23, further comprising:

in response to determining that the inner test window cannot be narrowed, determining if the memory flag has been set.

25. The method of claim 24, further comprising:

determining if updated electronic circuit characteristics include hysteresis;

in response to determining that updated electronic circuit characteristics include hysteresis, changing an electronic circuit parameter to a previous setting and eliminating hysteresis; and in response to determining that updated electronic circuit characteristics don't include hysteresis, changing an electronic circuit parameter to increase chances of hysteresis, and re-characterizing the electronic circuit.

26. The method of claim 18, wherein the electronic circuit comprises an amplifier.

27. A system for calibrating an electronic circuit, comprising an IC tester coupled with an IC interface board, the IC tester including a processor coupled with a data storage device, wherein the processor is programmed to perform a method comprising:

forwarding a series of analog test signals to an electronic circuit input, wherein the series includes an upward cycle and a downward cycle of analog test signals;

determining polarities of a series of electronic circuit responses to the series of analog test signals;

based on the polarities, determining one or more electronic circuit characteristics;

determining if an electronic circuit characteristic is acceptable; and in response to determining that the electronic circuit characteristic is not acceptable, changing an electronic circuit calibration parameter.

28. A tangible, computer-readable information storage medium including instructions adapted to direct a processor to perform a series of operations, the operations comprising:

forwarding a series of analog test signals to an electronic circuit input, wherein the series includes an upward cycle and a downward cycle of analog test signals;

determining polarities of a series of electronic circuit responses to the series of analog test signals;

based on the polarities, determining one or more electronic circuit characteristics;

determining if an electronic circuit characteristic is acceptable; and in response to determining that the electronic circuit characteristic is not acceptable, changing an electronic circuit calibration parameter.

* * * * *